(12) United States Patent
Lee et al.

(10) Patent No.: US 10,656,201 B2
(45) Date of Patent: May 19, 2020

(54) SEMICONDUCTOR DEVICE

(71) Applicant: RENESAS ELECTRONICS CORPORATION, Tokyo (JP)

(72) Inventors: Takuya Lee, Tokyo (JP); Tetsuya Kokubun, Tokyo (JP); Yutaka Nakadai, Tokyo (JP); Kenji Shiozawa, Ibaraki (JP); Yoshihide Nakamura, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 208 days.

(21) Appl. No.: 15/970,057

(22) Filed: May 3, 2018

(65) Prior Publication Data
US 2019/0004110 A1    Jan. 3, 2019

(30) Foreign Application Priority Data
Jun. 29, 2017 (JP) .................................. 2017-127226

(51) Int. Cl.
| | | |
|---|---|---|
| G06F 11/20 | (2006.01) | |
| G06F 11/27 | (2006.01) | |
| G01R 31/3167 | (2006.01) | |
| G01R 31/3187 | (2006.01) | |
| G06F 15/78 | (2006.01) | |

(52) U.S. Cl.
CPC ..... *G01R 31/3167* (2013.01); *G01R 31/3187* (2013.01); *G06F 11/202* (2013.01); *G06F 11/27* (2013.01); *G06F 15/78* (2013.01)

(58) Field of Classification Search
CPC ......................... G06F 11/0724; G06F 11/202
USPC .......................................................... 714/11
See application file for complete search history.

(56) References Cited

U.S. PATENT DOCUMENTS

| | | | |
|---|---|---|---|
| 6,223,104 B1 * | 4/2001 | Kamen | A61G 5/061 701/1 |
| 2011/0208948 A1 * | 8/2011 | Knight | G06F 11/1497 712/31 |
| 2017/0365992 A1 * | 12/2017 | Shin | H02H 3/427 |
| 2018/0354487 A1 * | 12/2018 | Schreiber | G06F 11/14 |
| 2019/0356468 A1 * | 11/2019 | Zeh | H04L 9/0631 |

FOREIGN PATENT DOCUMENTS

| | | |
|---|---|---|
| JP | 09-325946 A | 12/1997 |
| JP | 2014-132384 A | 7/2014 |

\* cited by examiner

*Primary Examiner* — Chae M Ko
(74) *Attorney, Agent, or Firm* — McDermott Will & Emery LLP

(57) ABSTRACT

According to one embodiment, a semiconductor device performs processing based on a user program by using a user program, which is used in a normal mode, as an analysis program and making a plurality of peripheral circuits having the same function operate in lock-step where the plurality of peripheral circuits operate in the identical manner, and makes failure diagnosis of the peripheral circuits by determining match or mismatch of a plurality of analysis information respectively obtained from the plurality of peripheral circuits operating in lock-step.

15 Claims, 19 Drawing Sheets

SEMICONDUCTOR DEVICE

CROSS-REFERENCE TO RELATED APPLICATIONS

This application is based upon and claims the benefit of priority from Japanese patent application No. 2017-127226, filed on Jun. 29, 2017, the disclosure of which is incorporated herein in its entirety by reference.

BACKGROUND

The present disclosure relates to a semiconductor device and, for example, relates to a semiconductor device including a CPU core and a plurality of peripheral circuits used for the CPU core.

Vehicle-mounted control systems are required to be built with functional safety design in each single part today. Particularly, vehicle control MCUs (Micro Controller Units) are required to improve their failure self diagnosis functions. An example of failure self diagnosis functions is a function of detecting whether a failure such as CMOS breakdown is occurring by making a DFT (Design For Test) circuit operate in a single semiconductor device (Field-BIST: DFT circuit that can be used in client environments). Another example of failure self diagnosis functions is disclosed in Japanese Unexamined Patent Application Publications Nos. H9-325946 and 2014-132384.

The microprocessor disclosed in Japanese Unexamined Patent Application Publication No. H9-325946 supplies the same test pattern generated in a test pattern generation circuit to a plurality of microprocessors at the same time, compares and determines, by a comparator circuit, whether test results obtained in those microprocessors are all the same or not, and, when they are all the same, determines that all of the microprocessors are operating normally.

The microcomputer disclosed in Japanese Unexamined Patent Application Publication No. 2014-132384 includes an output comparison unit that compares outputs of a main core and a checker core in a normal operation mode, a shift result comparison unit that compares outputs of scan chains of the main core and the checker core in a mismatch location specification mode, a table storage unit that stores a table containing information about a plurality of flip-flops and a plurality of functional blocks, and a control unit that switches the mode to the mismatch location specification mode when a mismatch is detected by the output comparison unit in the normal operation mode, and extracts, from the table, the functional block corresponding to the flip-flop specified based on a comparison result of the shift result comparison unit and stops the function of the functional block in the mismatch location specification mode.

SUMMARY

Even with use of the techniques disclosed in Japanese Unexamined Patent Application Publications Nos. H9-325946 and 2014-132384, it is not possible to carry out failure diagnosis while dynamically controlling the functions of a whole chip including peripheral circuits used by a CPU core that executes a program. Such failure diagnosis with dynamic control of functions would enable specification of the address or bit of a failed register without use of a test pattern or the like. However, the techniques disclosed in Japanese Unexamined Patent Application Publications Nos. H9-325946 and 2014-132384 require a test pattern and are thus not able to carry out failure diagnosis with dynamic control of functions, and it takes a long time to narrow down failure locations.

The other problems and novel features of the present invention will become apparent from the description of the present specification and the accompanying drawings.

According to one embodiment, a semiconductor device performs processing based on a user program by using a user program, which is used in a normal mode, as an analysis program and making a plurality of peripheral circuits having the same function operate in lock-step fashion where the plurality of peripheral circuits operate in the identical manner, and makes failure diagnosis of the peripheral circuits by determining match or mismatch of a plurality of analysis information respectively obtained from the plurality of peripheral circuits operating in lock-step fashion.

According to the one embodiment described above, it is possible to shorten the time needed to narrow down failure locations.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
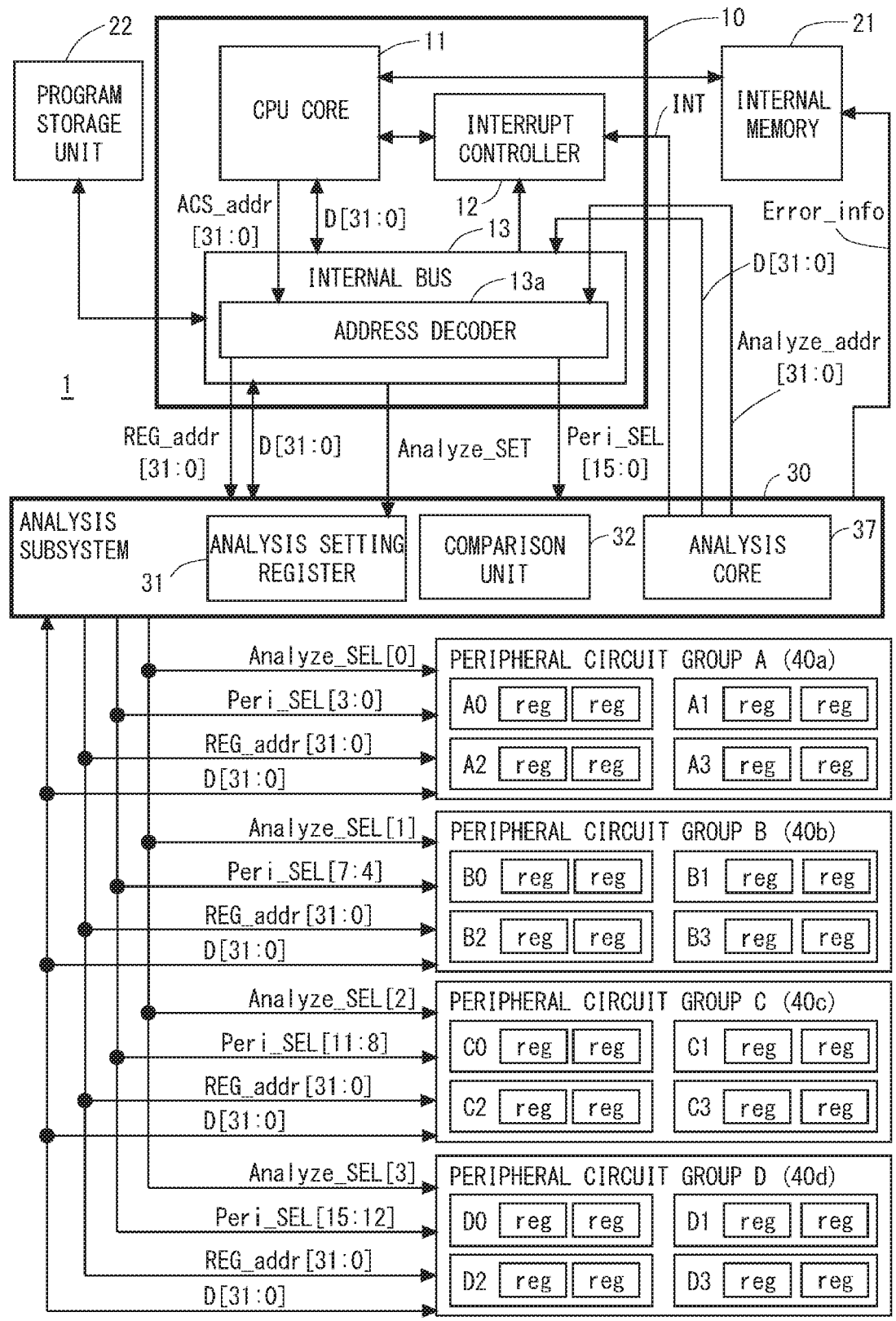
FIG. 1 is a block diagram of a semiconductor device according to a first embodiment.

The following description and the attached drawings are appropriately shortened and simplified to clarify the explanation. Further, elements that are shown as functional blocks for performing various kinds of processing in the drawings may be configured by a CPU (Central Processing Unit), a memory or another circuit as hardware or may be implemented by a program loaded to a memory or the like as software. It would be thus obvious to those skilled in the art that those functional blocks may be implemented in various forms such as hardware only, software only or a combination of those, and not limited to either one. In the figures, the identical reference symbols denote identical structural elements and the redundant explanation thereof is omitted.

Further, the above-described program can be stored and provided to the computer using any type of non-transitory computer readable medium. The non-transitory computer readable medium includes any type of tangible storage medium. Examples of the non-transitory computer readable medium include magnetic storage media (such as floppy disks, magnetic tapes, hard disk drives, etc.), optical magnetic storage media (e.g. magneto-optical disks), CD-ROM (Read Only Memory), CD-R , CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable medium. Examples of the transitory computer readable medium include electric signals, optical signals, and electromagnetic waves. The transitory computer readable medium can provide the program to a computer via a wired communication line such as an electric wire or optical fiber or a wireless communication line.

Further, in a semiconductor device 1 according to a first embodiment, a program is executed in an arithmetic device such as a CPU core and an analysis core, and in the following description, a process of fetching (or reading) an instruction written in a program in accordance with a fetch address, which is a count value of a program counter in the arithmetic device, and executing the fetched instruction is referred to as "executing a program". Further, an operation instruction that is generated as a result of executing an instruction in an arithmetic circuit is issued from the arithmetic device to peripheral circuits, and thereby the peripheral circuits perform an operation based on the operation instruction. Specifically, an arithmetic device such as a CPU core generates an access signal (or a control signal) by executing a program, and gives an operation instruction to peripheral circuits with use of the access signal. To be more specific, the peripheral circuit includes a plurality of registers, and those registers store a value given by the access signal, and the peripheral circuits perform various operations in accordance with the value.

FIG. 1 shows a block diagram of the semiconductor device 1 according to the first embodiment. As shown in FIG. 1, the semiconductor device 1 according to the first embodiment includes a CPU system 10, an internal memory 21, a program storage unit 22, an analysis subsystem 30, and peripheral circuit groups 40a to 40d. The semiconductor device 1 according to the first embodiment includes a CPU core 11 and an analysis core 37 as a program execution unit that executes a user program. The CPU core 11 executes the user program mainly in a normal operation mode, and the analysis core 37 executes the user program mainly in an analysis mode. The semiconductor device 1 according to the first embodiment, including the operation of the CPU core 11 and the operation of the analysis core 37, is described in detail hereinbelow.

The internal memory 21 holds data that is generated during execution of a program by a first CPU core (e.g., the CPU core 11) in the CPU system 10. Further, the internal memory 21 holds error information Error_Info that is output from the analysis subsystem 30.

The program storage unit 22 may be a memory formed on the same semiconductor chip as the CPU system 10 or may be a memory formed on a different semiconductor chip from the CPU system 10. The program storage unit 22 stores a program to be executed by the CPU system 10.

In one example shown in FIG. 1, the CPU system 10 includes a first CPU core (e.g., the CPU core 11), an interrupt controller 12, and an internal bus 13. In the CPU system 10, the CPU core 11 executes a program stored in the program storage unit 22. There are various programs executed by the CPU core 11 in the semiconductor device 1 according to the first embodiment, such as an OS (Operating System) that manages a user program and a user program created by a user, and an example in which the CPU core 11 executes a user program is described hereinafter.

The interrupt controller 12 receives an interrupt request from an analysis core 37 in the analysis subsystem 30 or the peripheral circuit groups 40a to 40d, and instructs the CPU core 11 to perform interrupt processing. When the CPU core 11 is instructed to perform interrupt processing, it performs predetermined exception processing, and, at the end of the processing, instructs the interrupt controller 12 to clear the interrupt request.

The internal bus 13 is one of a plurality of buses in the semiconductor device 1, and it supplies an address signal and a data signal to another circuit. The address signal indicates a value that is the destination of an operation instruction and data that are output from a program execution unit such as a CPU core. The internal bus 13 includes an address decoder 13a. The address decoder 13a decodes an access address ACS_addr that is output from the CPU core 11 and generates an address signal to be supplied to the destination indicated by the access address ACS_addr. In the example shown in FIG. 1, the address decoder 13a decodes the access address ACS_addr and generates a register address signal REG_addr and a module address signal Peri_SEL.

The analysis subsystem 30 performs defect analysis of the peripheral circuit groups 40a to 40d based on a user program in accordance with an instruction from the CPU core 11. The analysis subsystem 30 at least includes an analysis setting register 31, a comparison unit 32, and a second CPU core (e.g., the analysis core 37). The detailed configuration of the analysis subsystem 30 that includes those circuit blocks is described later.

Only the address signal and data paths when the analysis core 37 is operating are described hereinbelow. The analysis core 37 is a program execution unit included in the analysis subsystem 30, and it has the same configuration as the CPU core 11. When the analysis core 37 performs defect analysis of the peripheral circuit groups 40a to 40d, it executes a user program stored in the program storage unit 22. When the analysis core 37 executes the user program, it outputs an analysis address Analyze_addr and data D. The analysis address Analyze_addr and the data D are transmitted to the peripheral circuit groups 40a to 40d through the internal bus 13 in the CPU system 10 and the analysis core 37. Further, the data D generated by processing performed by the peripheral circuit groups 40a to 40d based on the data D supplied from the analysis core 37 is transmitted to the analysis core 37 through the analysis core 37 and the internal bus 13.

Each of the peripheral circuit groups 40a to 40d is a set of a plurality of peripheral circuits having the same circuit configuration. Peripheral circuits that belong to different peripheral circuit groups have different circuit configurations from each other. Examples of the peripheral circuits are a coprocessor, a timer, a digital-to-analog converter circuit, an analog-to-digital converter circuit and the like.

In the semiconductor device 1 according to the first embodiment, a specific peripheral circuit is enabled based on the module address signal Peri_SEL generated from the access address ACS_addr. Further, in the semiconductor device 1 according to the first embodiment, a specific register (reg in FIG. 1) in the enabled peripheral circuit is enabled based on a register address signal REG_addr generated from the access address ACS_addr. Then, the data D is stored into the enabled register. The data D contains an operation instruction to give the peripheral circuit an instruction regarding an operation to be performed and a numerical value to be computed.

Further, in the semiconductor device 1 according to the first embodiment, the analysis subsystem 30 switches an analysis execution setting signal Analyze_SET between Enabled and Disabled based on analysis execution set values applied to the analysis setting register 31. In the peripheral circuit group to which the enabled analysis execution setting signal Analyze_SET is applied, at least two peripheral circuits included in the peripheral circuit group are enabled at the same time. Then, the data D is equally given to registers of the peripheral circuits enabled at the same time.

The operation of the semiconductor device 1 according to the first embodiment is briefly described hereinbelow. The semiconductor device 1 according to the first embodiment has a normal operation mode in which a user program is executed by the CPU core 11 and a defect verification mode in which a user program is executed by the analysis core 37 to verify defects of peripheral circuits.

In the normal operation mode, the CPU core 11 issues an operation instruction to peripheral circuits based on a result of executing an instruction contained in the user program. Specifically, in the normal operation mode, the CPU core 11 in the semiconductor device 1 carries out processing regarding functions implemented by the user program with use of the peripheral circuits.

On the other hand, in the defect verification mode, the analysis core 37 issues an operation instruction to peripheral circuits based on a result of executing an instruction contained in the user program. Further, in the defect verification mode, the analysis subsystem 30 switches, to Enabled, an analysis execution setting signal Analyze_SET corresponding to a peripheral circuit group that includes analysis target peripheral circuits, so that the analysis target peripheral circuits and a plurality of peripheral circuits having the same circuit configuration as the analysis target peripheral circuits operate under the same operation instruction. Then, in the defect verification mode, the analysis subsystem 30 compares processing results obtained from the plurality of peripheral circuits having operated under the same operation instruction, and thereby analyzes defects of the peripheral circuits.

Figure 2:
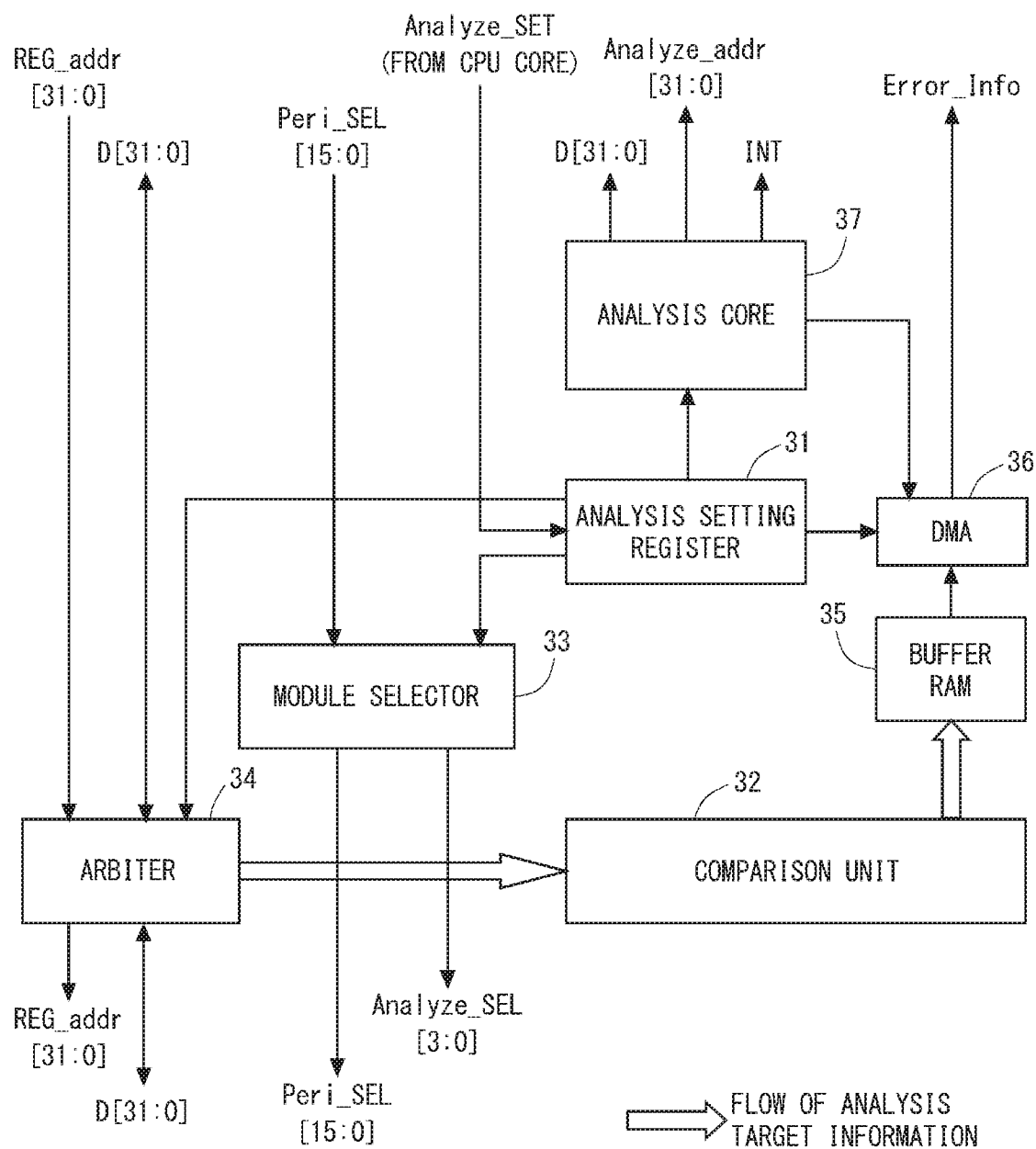
FIG. 2 is a block diagram of an analysis subsystem according to the first embodiment.

The analysis subsystem 30 is described in detail below. FIG. 2 shows a block diagram of the analysis subsystem 30 according to the first embodiment. As shown in FIG. 2, the analysis subsystem 30 according to the first embodiment includes an analysis setting register 31, a comparison unit 32, a module selector 33, an arbiter 34, a buffer RAM 35, a DMA circuit 36, and an analysis core 37.

The analysis core 37 executes a user program by using a comparison target peripheral circuit which is included in an analysis target peripheral circuit group based on a fetch address stored as one of analysis execution set values by the CPU core 11 into the analysis setting register 31. Note that the analysis target peripheral circuit group and the comparison target peripheral circuit are specified by the analysis execution set values stored in the analysis setting register 31. Further, when the CPU core 11 stores a fetch address into the analysis setting register 31, it stops the execution of the user program until the execution of the user program by the analysis core 37 stops, or executes the program by using peripheral circuits which are not included in the analysis target peripheral circuit group. In the semiconductor device 1 according to the first embodiment, an example of stopping the execution of the user program until the execution of the user program by the analysis core 37 stops is described.

The analysis setting register 31 stores various set values given by the analysis execution setting signal Analyze_SET supplied from the CPU core 11. To be specific, the analysis setting register 31 stores analysis execution set values at least including an analysis target peripheral circuit set value and a comparison target peripheral circuit set value, a start fetch address identifying a point to start processing of the user program executed by the analysis core 37, and an end fetch address identifying a point to end processing of the user program executed by the analysis core 37.

The analysis target peripheral circuit set value is a set value that specifies an analysis target peripheral circuit group that includes a plurality of analysis target peripheral circuits to be used for defect analysis among the peripheral circuits included in the peripheral circuit groups 40a to 40d. The comparison target peripheral circuit set value indicates a comparison target peripheral circuit to be compared among the peripheral circuits included in the analysis target peripheral circuit group. The comparison target peripheral circuit is a peripheral circuit to be analyzed.

The comparison unit 32 compares information obtained from each of the plurality of peripheral circuits included in the analysis target peripheral circuit group based on analysis information containing at least one of an address and data that are input to and output from the analysis target peripheral circuit, and outputs error information indicating the location of a bit indicating a different value. The comparison unit 32 is described in detail later.

The module selector 33 outputs an individual module address signal that puts each of a plurality of peripheral circuits individually into the operating state based on a module address signal supplied from the first CPU core in the normal operation mode where the analysis execution set values are not stored in the analysis setting register 31. To be specific, the module selector 33 converts a peripheral address signal Peri_addr that is generated from an access address ACS_addr by the address decoder 13a in the internal bus 13 into a module address signal Peri_SEL that enables each peripheral circuit individually. The address conversion from the peripheral address signal Peri_addr to the module address signal Peri_SEL by the module selector 33 is performed by decoding that converts address values under specified rules.

On the other hand, in the defect analysis mode where the analysis execution set values are stored in the analysis setting register 31, the module selector 33 outputs an analysis target selection signal that gives an operation instruction so that at least two analysis target peripheral circuits included in the analysis target peripheral circuit group operate based on the analysis target peripheral circuit set value, regardless of the module address signal. The module selector 33 according to the first embodiment controls the peripheral circuits so that all of the analysis target peripheral circuits included in the analysis target peripheral circuit group operate. To be specific, the module selector 33 switches the analysis target selection signal Analyze_SEL corresponding to a plurality of peripheral circuits indicated by the analysis target peripheral circuit set value from Disabled to Enabled.

The arbiter 34 arbitrates the data D that is input to and output from a plurality of peripheral circuits based on the register address signal REG_addr that is input to the plurality of peripheral circuits in the normal operation mode. In the defect analysis mode, the arbiter 34 extracts analysis information containing at least one of an address and data that are input to and output from the analysis target peripheral circuits based on the analysis target peripheral circuit set value, and transmits the data that is output from the comparison target peripheral circuit to a circuit located on the upstream side (e.g., the CPU core 11 and the analysis core 37 sides which have made the operation instruction to the peripheral circuits) based on the comparison target peripheral circuit set value. To be more specific, the arbiter 34 distributes, to the analysis target peripheral circuits, the operation instruction that is output from the program execution unit (e.g., the CPU core 11 or the analysis core 37) to the comparison target peripheral circuit based on the comparison target peripheral circuit set value and the analysis target peripheral circuit set value. Then, the arbiter 34 extracts, as analysis information, the data that is output from the plurality of peripheral circuits included in the analysis target peripheral circuit group in response to the given operation instruction. Further, the arbiter 34 transmits the data that is output from the comparison target peripheral circuit to the CPU core 11 or the analysis core 37 which has made the operation instruction.

The buffer RAM 35 holds the error information generated by the comparison unit 32 in the order of generation. The DMA circuit 36 outputs the error information Error_Info held in the buffer RAM 35 to the internal memory 21 in accordance with an instruction from the analysis core 37.

Figure 3:
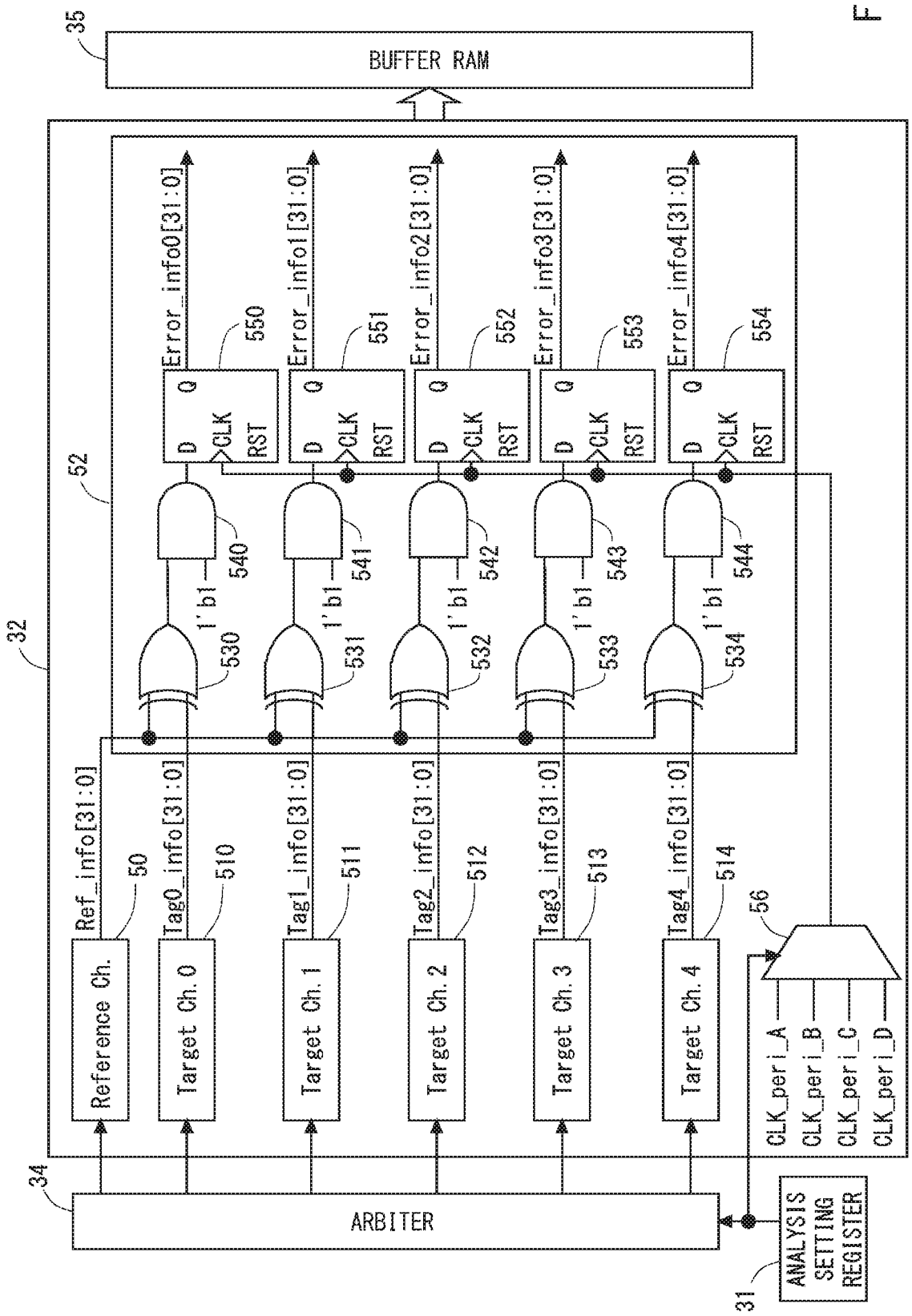
FIG. 3 is a block diagram of a comparison unit according to the first embodiment.

The comparison unit 32 is described in detail hereinafter. FIG. 3 shows a block diagram of the comparison unit 32 according to the first embodiment. Note that, in FIG. 3, the arbiter 34, from which information is input to the comparison unit 32, the analysis setting register 31, which supplies the analysis target peripheral circuit set value and the comparison target peripheral circuit set value to the arbiter 34, and the buffer RAM 35, to which information is output from the comparison unit 32, are also shown with the comparison unit 32.

As shown in FIG. 3, the comparison unit 32 includes a reference channel register 50, target channel registers 510 to 514, a comparator core 52, and a clock selector 56. The reference channel register 50 stores analysis information regarding the peripheral circuit that is designated as the comparison target peripheral circuit. Each of the target channel registers 510 to 514 stores analysis information regarding the analysis target peripheral circuits excluding the comparison target peripheral circuit. Note that the analysis information contains data to be input to and output from the peripheral circuit and address information that designates the peripheral circuit.

In the comparator core 52, XOR circuits (530 to 534 in FIG. 3), AND circuits (540 to 544 in FIG. 3) and D flip-flop circuits (550 to 554 in FIG. 3) are placed respectively corresponding to the target channel registers 510 to 514. Note that the relation of connection among the XOR circuit, the AND circuit and the latch circuit is the same for each corresponding target channel register. In the following description, only the relation of connection among the XOR circuit, the AND circuit and the D flip-flop circuit which corresponds to the target channel register 510 is described below.

The XOR circuit 530 outputs a result of exclusive OR between target information Tag0_info stored in the target channel register 510 and reference information Ref_info stored in the reference channel register 50. Specifically, an output value of the XOR circuit 530 is "0" when the target information Tag0_info and the reference information Ref_info match, and it is "1" when they do not match.

The AND circuit 540 outputs a result of logical AND between the output value of the XOR circuit 530 and the value "1". Specifically, the AND circuit 540 outputs "1" when the output value of the XOR circuit 530 is "1", and outputs "0" when the output value of the XOR circuit 530 is "0".

The D flip-flop circuit 550 holds the output value of the AND circuit 540 at the rising edge of a clock signal. The output value of the D flip-flop circuit 550 is the error information Error_Info. The operating clock of the D flip-flop circuit 550 is determined as a result that the clock selector 56 selects the operating clock to be applied to the peripheral circuit group that includes the analysis target peripheral circuit from the operating clocks applied to the peripheral circuit groups 40a to 40d. To be specific, the clock selector 56 determines the operating clock to be selected based on the analysis target peripheral circuit set value stored in the analysis setting register 31. In other words, the comparison unit 32 operates based on the operating clock applied to the analysis target peripheral circuit group among the operating clocks applied to the peripheral circuit groups. Note that a two-phase latch circuit may be used in place of the D flip-flop circuit.

In the above circuit configuration, when the comparison target peripheral circuit is failed, the comparison unit 32 outputs the error information where all the error information Error_Info corresponding to the analysis target peripheral circuits are "1". Further, when either one analysis target peripheral circuit is failed, the comparison unit 32 outputs the error information where the error information Error_Info corresponding to the failed analysis target peripheral circuit is "1" and the other error information Error_Info is "0".

In the semiconductor device 1 according to the first embodiment, the error information Error_Info is generated in this manner and stored into the internal memory 21. A person in charge of analysis then analyzes this error information Error_Info and thereby identifies the defective peripheral circuit. Note that the CPU core 11 may analyze the generated error information Error_Info and recognize the defective peripheral circuit, and perform processing to avoid the use of the defective peripheral circuit in the subsequent execution of the user program.

Figure 4:
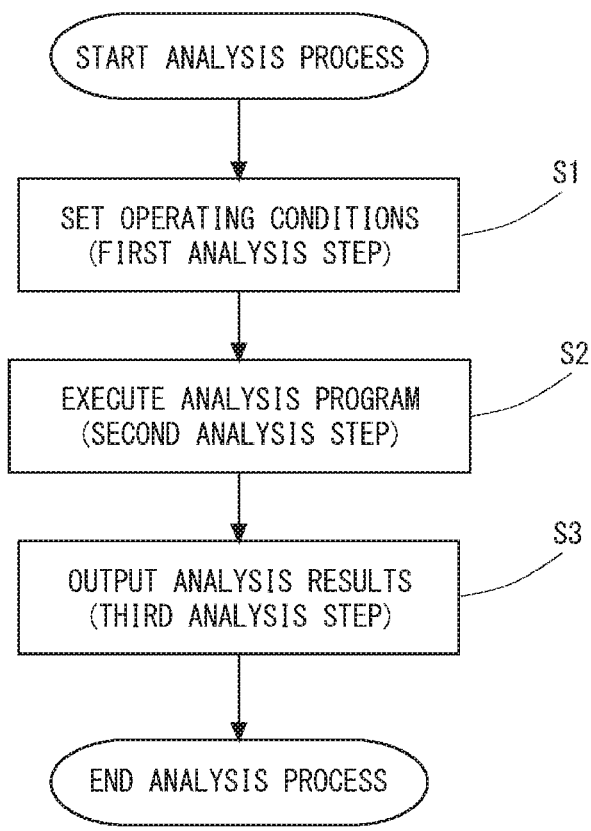
FIG. 4 is a flowchart showing the flow of an analysis process of the semiconductor device according to the first embodiment.

The operation of the analysis mode, which is a characteristic operation in the semiconductor device 1 according to the first embodiment among the operations of the semiconductor device 1 according to the first embodiment, is described hereinbelow. FIG. 4 is a flowchart showing the flow of an analysis process of the semiconductor device according to the first embodiment.

The semiconductor device 1 according to the first embodiment starts the analysis mode, triggered by an event such as issuance of an interrupt request that notifies the occurrence of an abnormality from a peripheral circuit or issuance of an analysis mode start instruction, which is input intentionally, as an interrupt request to the CPU core 11, for example. As shown in FIG. 4, after starting the analysis mode, the semiconductor device 1 according to the first embodiment performs a first analysis step that sets operating conditions to the analysis subsystem 30 (Step S1).

Next, the semiconductor device 1 performs a second analysis step that executes an analysis program that is used for analysis of a user program or the like by using the analysis core 37 (Step S2). After that, the semiconductor device 1 performs a third analysis step that outputs an execution result of the analysis program executed in Step S2 (Step S3).

Figure 5:
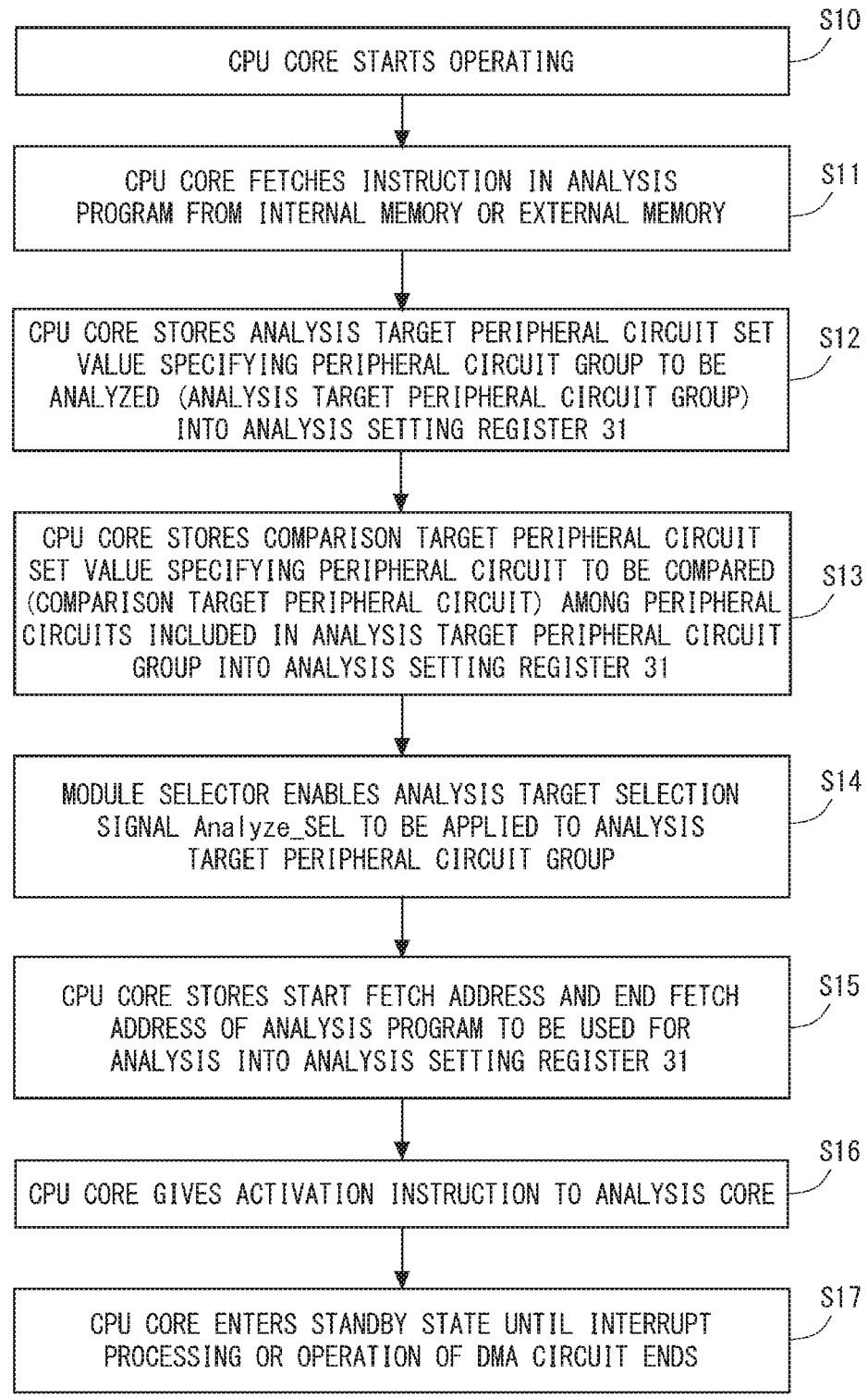
FIG. 5 is a flowchart showing the flow of a first analysis step of the semiconductor device according to the first embodiment.

The detailed process flow of the first analysis step to the third analysis step is described hereinafter. FIG. 5 is a flowchart showing the flow of the first analysis step in the semiconductor device according to the first embodiment.

As shown in FIG. 5, in the first analysis step, the CPU core 11 starts operating (Step S10). Next, the CPU core 11 fetches an instruction in an analysis program (e.g., a user program) to be used for analysis from an internal memory or an external memory, and thereby the user program is executed (Step S11). It is assumed that the user program contains an instruction to generate analysis execution set values to be stored into the analysis setting register 31. Then, the CPU core 11 stores an analysis target peripheral circuit set value that specifies a peripheral circuit group to be analyzed (e.g., an analysis target peripheral circuit group) into the analysis setting register 31 (Step S12). Further, the CPU core 11 stores a comparison target peripheral circuit set value that specifies a peripheral circuit to be compared (e.g., a comparison target peripheral circuit) among the peripheral circuits included in the analysis target peripheral circuit group into the analysis setting register (Step S13). By the operations in the Steps S12 and S13, the module selector 33 refers to the analysis execution set values in the analysis setting register 31, and switches the analysis target selection signal Analyze_SEL to be applied to the analysis target peripheral circuit group to Enabled (Step S14). As a specific example with reference to FIG. 1, in the case where peripheral circuits specified by the analysis target peripheral circuit set value are the peripheral circuits A0 to A3 included in the peripheral circuit group 40a, the module selector 33 sets the analysis target selection signal Analyze_SEL[0] among the analysis target selection signals Analyze_SEL[0] to Analyze_SEL[3] to Enabled (e.g., High level).

Then, the CPU core 11 stores a start fetch address and an end fetch address, which specify the start point and the end point of the user program to be used for analysis, into the analysis setting register 31 based on an instruction in the user program (Step S15). After that, the CPU core 11 gives an activation instruction to the analysis core 37 (Step S16), and enters the standby state until interrupt processing from the peripheral circuit or the analysis core 37 or the operation of the DMA circuit ends (Step S17).

Figure 6:
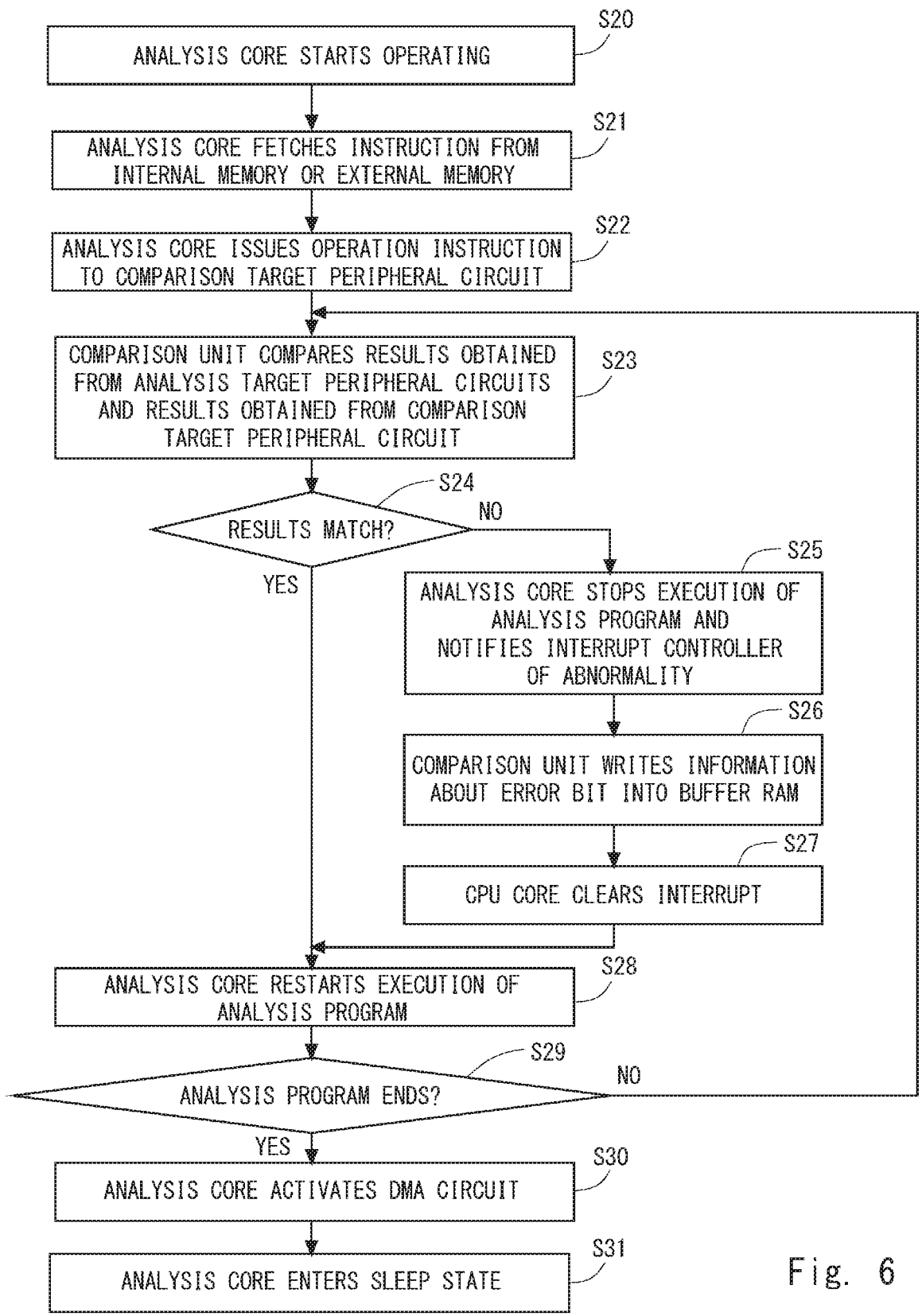
FIG. 6 is a flowchart showing the flow of a second analysis step of the semiconductor device according to the first embodiment.

FIG. 6 is a flowchart showing the flow of the second analysis step in the semiconductor device 1 according to the first embodiment. As shown in FIG. 6, in the second analysis step of the semiconductor device 1 according to the first embodiment, the process begins with the start of the operation of the analysis core 37 based on the activation instruction to the analysis core 37 in Step S16 of the first analysis step (Step S20).

After starting operating, the analysis core 37 starts the execution of the user program by fetching an instruction in the user program stored in the internal memory 21 or the internal memory 21 based on the start fetch address stored in the analysis setting register 31 (Step S21). Then, the analysis core 37 issues an operation instruction (an instruction generated by the execution of the instruction in the user program) to the comparison target peripheral circuit based on the user program (Step S22). The operation instruction that is issued to the comparison target peripheral circuit in Step S22 is distributed by the arbiter 34 to a plurality of peripheral circuits specified as the analysis target peripheral circuits.

Then, the comparison unit 32 compares results obtained as a result that the peripheral circuits operate in accordance with the operation instruction (Step S23). In Step S23, the arbiter 34 extracts signals exchanged between the analysis core 37 and the analysis target peripheral circuit group based on the analysis target peripheral circuit set value and the comparison target peripheral circuit set value stored in the analysis setting register 31 and supplies the signals to the comparison unit 32.

To be specific, when the analysis information is an address signal, the arbiter 34 applies the address signal to be applied to the comparison target peripheral circuit specified based on the comparison target peripheral circuit set value to the comparison target peripheral circuit, and further stores this address signal into the target channel register 510. Further, the arbiter 34 applies the address signal that specifies the comparison target peripheral circuit to the analysis target peripheral circuit group excluding the comparison target peripheral circuit, and further stores the address signal to be applied to the analysis target peripheral circuit group into the target channel registers 510 to 514. On the other hand, when the analysis information is data, the arbiter 34 controls the transmission and reception of data so that the data to be transmitted and received between the comparison target peripheral circuit specified based on the comparison target peripheral circuit set value and the analysis core 37 is transmitted to and received from the analysis core 37, and stores the data into the target channel register 510. Further, the arbiter 34 applies the same data as the comparison target peripheral circuit to the analysis target peripheral circuit group excluding the comparison target peripheral circuit, and further stores the data that is input to and output from the analysis target peripheral circuit group into the target channel registers 510 to 514.

Then, when it is determined by the comparison in Step S23 that the analysis information acquired from the peripheral circuits included in the analysis target peripheral circuit group match (Yes in Step S24), the analysis core 37 restarts the execution of the user program, and repeats the operations from Step S22 to Step S28 (Step S29).

On the other hand, when it is determined by the comparison in Step S23 that the analysis information acquired from the peripheral circuit included in the analysis target peripheral circuit group contains a bit that does not match the other comparison result (No in Step S24), the analysis core 37 stops the execution of the user program and makes an interrupt request to the interrupt controller 12 and thereby notifies the CPU core 11 of the occurrence of an abnormality (Step S25). Then, the comparison unit 32 writes information about the error bit as the error information Error_Info into the buffer RAM 35 (Step S26). After that, the CPU core 11 clears the interrupt request of the analysis core 37, and the analysis core 37 restarts the operation (Step S27). Because the analysis core 37 thereby restarts operating, the analysis core 37 restarts the execution of the user program (Step S28), Then, the analysis core 37 continues the operations from Step S22 to Step S28 until the execution position of the user program reaches the end fetch address (Step S29).

When it is determined in Step S29 that the analysis process where the analysis core 37 executes the user program has ended, the analysis core 37 activates the DMA circuit 36 (Step S30). After that, the analysis core 37 enters the sleep state (Step S31).

Figure 7:
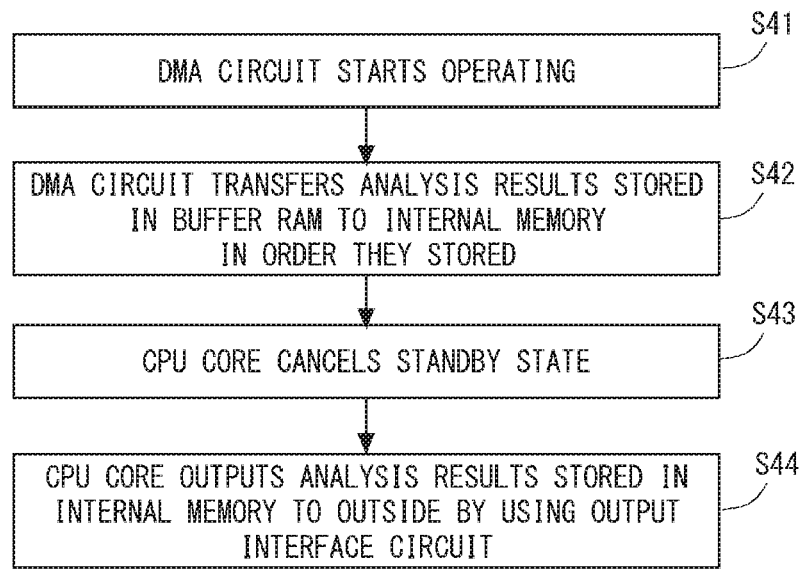
FIG. 7 is a flowchart showing the flow of a third analysis step of the semiconductor device according to the first embodiment.

FIG. 7 is a flowchart showing the flow of the third analysis step in the semiconductor device according to the first embodiment. As shown in FIG. 7, in the third analysis step, the DMA circuit 36 is activated based on the instruction from the analysis core 37 in Step S30 in the second analysis step (Step S41). Then, the DMA circuit 36 transfers, to the internal memory 21, the analysis results (e.g., the error information Error_Info) stored in the buffer RAM 35 in the order they stored (Step S42). In response to completion of transfer of the error information Error_Info from the buffer RAM 35 to the internal memory 21, the CPU core 11 cancels the standby state (Step S43). The CPU core then outputs the error information Error_Info stored in the internal memory 21 to the outside by using an output interface circuit (not shown) (Step S44).

By the above description, the semiconductor device 1 according to the first embodiment applies the address signal or data to be applied to one comparison target peripheral circuit to at least one analysis target peripheral circuit in the same configuration as the comparison target peripheral circuit in the analysis mode, so that the comparison target peripheral circuit and the analysis target peripheral circuit operate under the same operation instruction. Then, the semiconductor device 1 according to the first embodiment compares the execution results obtained from the peripheral circuits that operate under the same operation instruction and thereby obtains the error information Error_Info for analyzing defects in the peripheral circuits. Further, the semiconductor device 1 according to the first embodiment issues the operation instruction for making the peripheral circuits operate based on the user program in the analysis mode. Therefore, the semiconductor device 1 according to the first embodiment can analyze defects occurring in the peripheral circuits without preparing calibration for testing a scan circuit, a BIST (Built In Self-Test) circuit or the like.

A test method using a scan circit or a BIST test analyzes defects by applying a DFT (Design For Test) pattern for making the diagnosis of stack failure or memory cell destruction of a CMOS transistor in a signal propagation path between flip-flops to a scan circuit or a BIST circuit, it is difficult to identify the specific address of a failed register or memory.

Another test method inputs a function pattern to be used for functional evaluation or mass production test to a semiconductor device with use of a tester and thereby estimates a failure location and narrow down logics by its behavior. In this case, although failure analysis can be done easily when a failure occurs in a line or logic which can be covered by an existing function pattern, if a failure which is not covered by a function pattern and where operation check is not done by logic verification in a design process of the semiconductor device occurs, it is needed to create a new test pattern for failure analysis.

Further, by increasing DFT patterns and function patterns, the rising tendency of a circuit defect coverage rate becomes moderate or approaches the saturated state. Assuming that the coverage rate reaches 90%, to achieve additional rise of 1%, it is required to create a pattern for covering a specific line to be analyzed, and it is not realistic to create such a pattern.

However, the semiconductor device 1 according to the first embodiment carries out defect verification by using a user program where a defect is occurring, and it is thereby possible to verify defects in peripheral circuits without adding a test circuit or adding a DFT pattern or a function pattern. With use of the semiconductor device 1 according to the first embodiment, it is possible to significantly reduce man-hours and time needed for a test.

Further, in the semiconductor device 1 according to the first embodiment, it is possible to verify defects in units of registers or in units of bits in a register in a peripheral circuit. The semiconductor device 1 according to the first embodiment can thereby continue the execution of a program in the CPU system 10 by disabling a register where a defect is occurring.

Second Embodiment

In a second embodiment, another embodiment of the operation of the CPU core 11 during the analysis mode in the semiconductor device 1 according to the first embodiment is described. In the semiconductor device 1 according to the first embodiment, the CPU core 11 enters the standby state and does not execute a program during the analysis mode where the analysis core 37 executes a user program that is used for analysis. On the other hand, in the semiconductor device 1 according to the second embodiment, the CPU core 11 does not enter the standby state and executes a user program during the analysis mode. Note that, in the case of performing the operation according to the second embodiment, the same hardware configuration as that of the semiconductor device 1 according to the first embodiment is used, and only the software configuration is different from that of the first embodiment, and therefore the identical reference symbols as those in the first embodiment are used as the reference symbols of the semiconductor device in the second embodiment.

Figure 8:
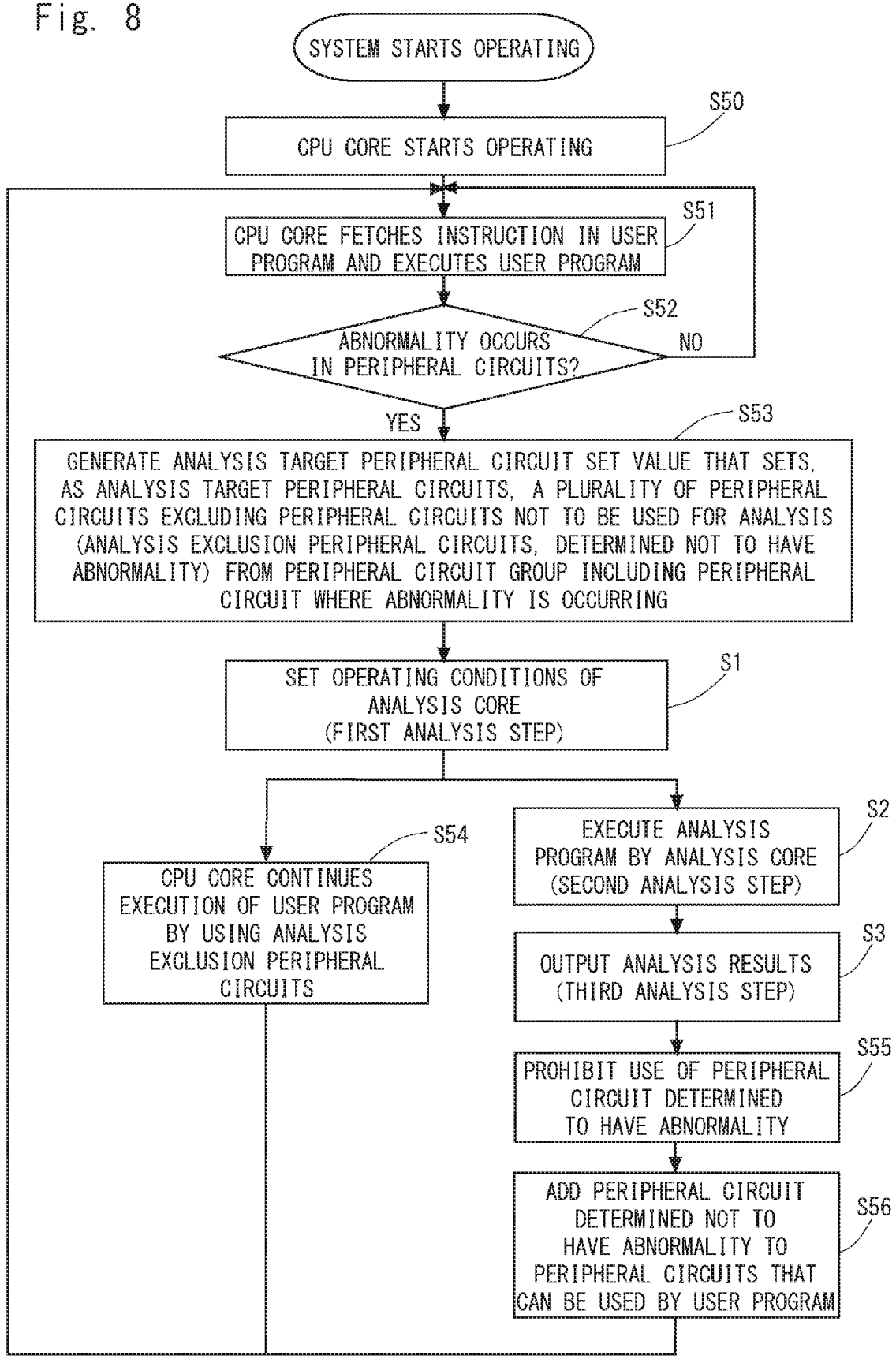
FIG. 8 is a flowchart showing the flow of an analysis process of a semiconductor device according to a second embodiment.

FIG. 8 is a flowchart showing the flow of an analysis process of the semiconductor device according to the second embodiment. As shown in FIG. 8, in the semiconductor device 1 according to the second embodiment, the CPU core 11 starts operating in Step S50. The CPU core 11 then fetches an instruction in a user program that is stored in the program storage unit 22 or the like and executes the user program (Step S51). Peripheral circuits are used in the execution of the user program in Step S51. The CPU core 11 continues the execution of the user program as long as there is no abnormality in the peripheral circuits (Step S52).

On the other hand, when the occurrence of an abnormality in a peripheral circuit is notified by an interrupt request during the execution of the user program, the CPU core 11 executes the processing of Step S53 as one of exception processing. In Step S53, an analysis target peripheral circuit set value that sets, as analysis target peripheral circuits, a plurality of peripheral circuits excluding peripheral circuits not to be used for analysis from a peripheral circuit group including the peripheral circuit where an abnormality is occurring is generated. Note that the peripheral circuits not to be used for analysis are peripheral circuits that are determined not to have an abnormality, and they are referred to as analysis exclusion peripheral circuits in the following description. Only some of peripheral circuits included in one peripheral circuit group are set to the analysis target peripheral circuit set value according to the second embodiment.

Then, the semiconductor device 1 according to the second embodiment performs the first analysis step to the third analysis step described in FIG. 4, and it further performs the processing of Step S54 in parallel with the second analysis step and the third analysis step. In the processing of Step S54, the execution of a user program is continued by using the analysis exclusion peripheral circuits.

Further, after completion of the third analysis step, the semiconductor device 1 according to the second embodiment prohibits the use of the peripheral circuit that is determined to have an abnormality (Step S55). On the other hand, the semiconductor device 1 according to the second embodiment adds the peripheral circuit that is determined not to have an abnormality to the peripheral circuits that can be used by a user program (Step S56).

By the above description, the semiconductor device 1 according to the second embodiment excludes some peripheral circuits in the analysis target peripheral circuit group which includes the comparison target peripheral circuit from the analysis operation, and continues the execution of a user program by using the excluded peripheral circuits. Further, the semiconductor device 1 according to the second embodiment can make the peripheral circuit determined by analysis to have no abnormality return to the state that can be used by a user program, and cease the use of the peripheral circuit having an abnormality in the subsequent operation. By such processing, the semiconductor device 1 according to the second embodiment can enhance the operational continuity of the semiconductor device.

Third Embodiment

Figure 9:
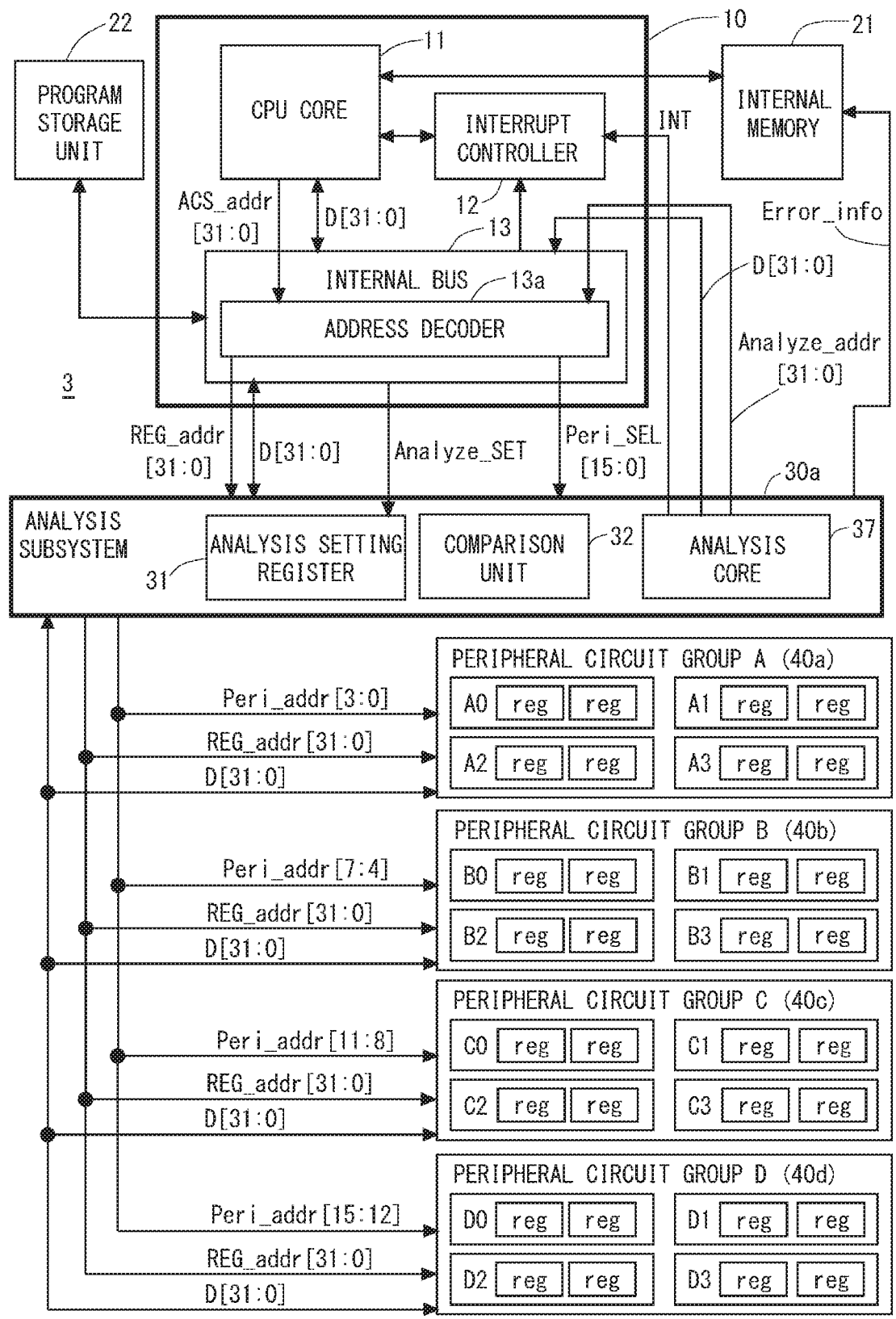
FIG. 9 is a block diagram of a semiconductor device according to a third embodiment.
Figure 10:
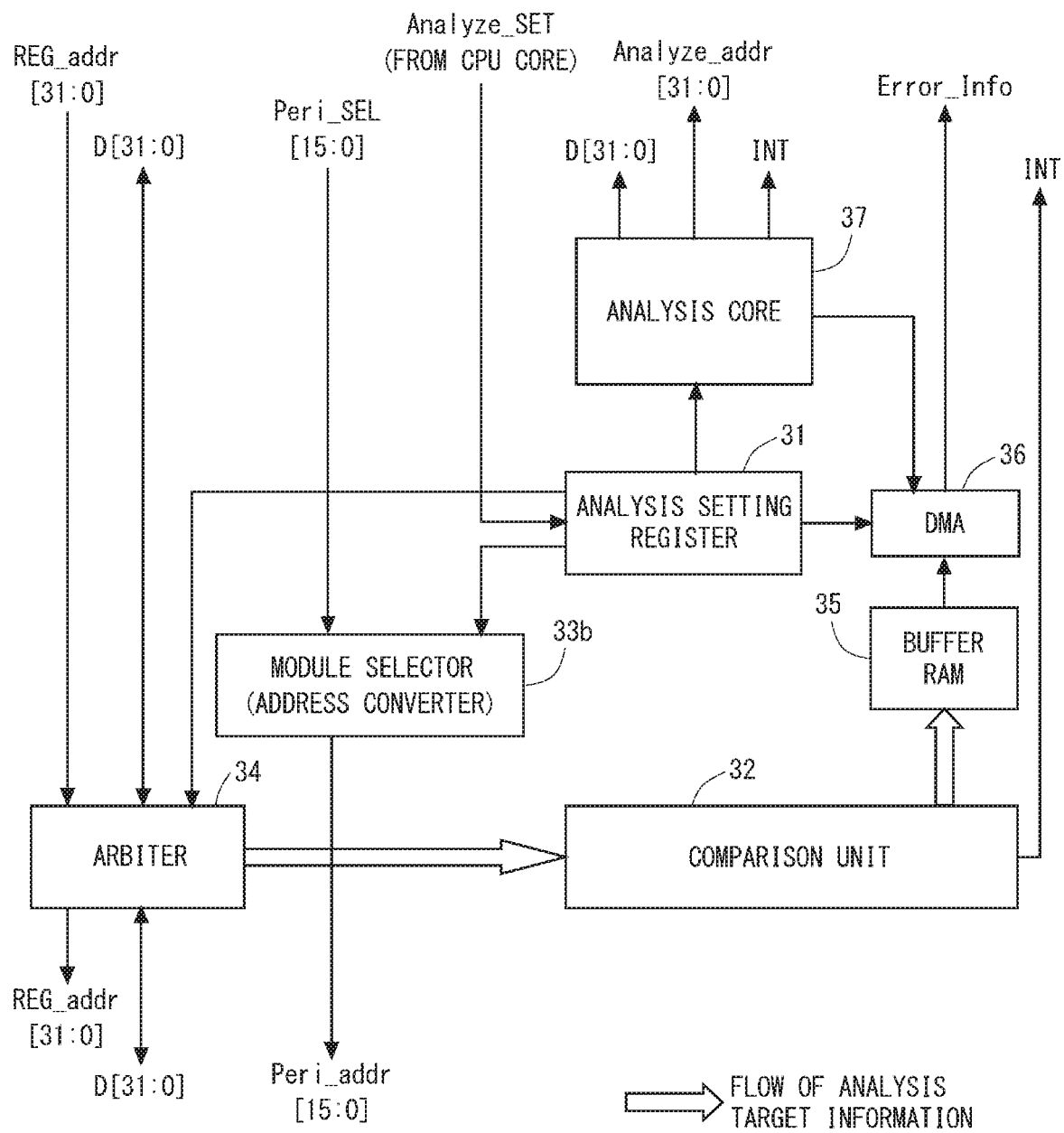
FIG. 10 is a block diagram of an analysis subsystem according to the third embodiment.

In a third embodiment, another embodiment of the module selector in the analysis subsystem 30 is described. FIG. 9 shows a block diagram of a semiconductor device 3 according to the third embodiment, and FIG. 10 shows a block diagram of an analysis subsystem 30a according to the third embodiment.

As shown in FIG. 9, the semiconductor device 3 according to the third embodiment includes the analysis subsystem 30a in place of the analysis subsystem 30. As shown in FIG. 9, the analysis subsystem 30a includes a module selector 33b in place of the module selector 33. Differences between the module selector 33 and the module selector 33b are described hereinafter in detail.

First, differences between the module selector 33 and the module selector 33b in the normal operation mode are described. The module selector 33 generates an address signal to peripheral circuits by decoding. On the other hand, the module selector 33b generates an address to peripheral circuits by address conversion.

To be specific, in the normal operation mode, the module selector 33 outputs an individual module address signal that puts each of a plurality of peripheral circuits into the operating state individually based on a module address signal Peri_SEL supplied from the CPU core 11 side. On the other hand, the module selector 33b shifts a module address signal Peri_SEL supplied from the CPU core 11 side by the shift amount determined for each peripheral circuit to be accessed and thereby generates a peripheral address signal Peri_addr that individually specifies the peripheral circuit.

Next, differences between the module selector 33 and the module selector 33b in the analysis mode are described. In the analysis mode, the module selector 33 outputs an analysis target selection signal that puts all of the analysis target peripheral circuits included in the analysis target peripheral circuit group into the operating state, regardless of a module address signal Peri_addr. On the other hand, in the analysis mode, the module selector 33b outputs a plurality of module address signals Peri_addr corresponding to all of the analysis target peripheral circuits included in the analysis target peripheral circuit group from a module address signal Peri_SEL, which serves as a base address signal.

Figure 11:
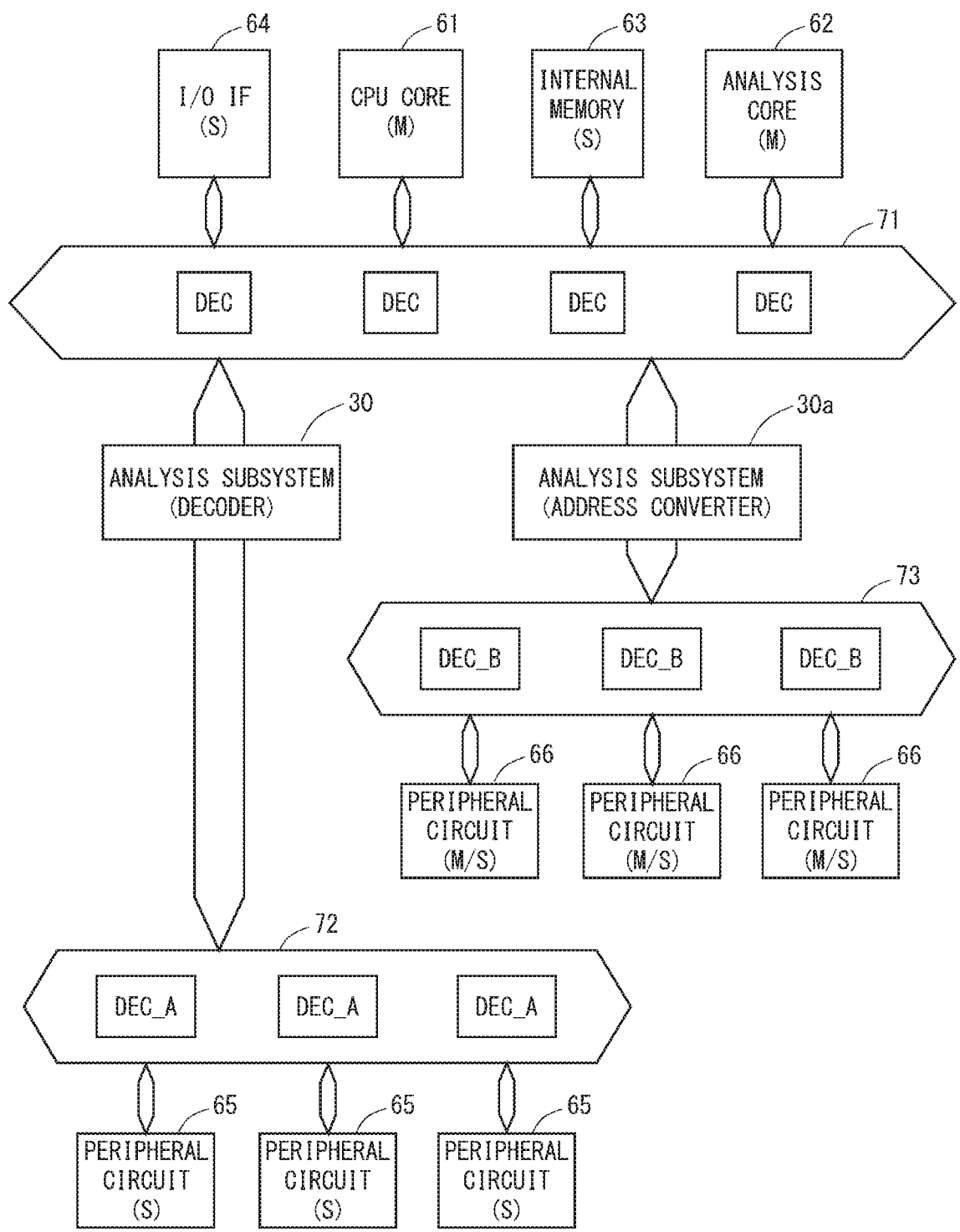
FIG. 11 is a view illustrating differences between the analysis subsystem according to the third embodiment and the analysis subsystem according to the first embodiment.

Whether to use the module selector 33 or the module selector 33b is determined by the circuit form of a bus that is placed between the analysis subsystem and peripheral circuits. FIG. 11 shows a view illustrating differences between the analysis subsystem according to the third embodiment and the analysis subsystem according to the first embodiment.

In the system configuration diagram shown in FIG. 11, a system is composed of a CPU core 61, an analysis core 62, an internal memory 63, an I/O interface circuit 64, peripheral circuits 65 and 66, an internal bus 71, a first bus (e.g., a sub-internal bus 72), a second bus (e.g., a sub-internal bus 73), and analysis subsystems 30 and 30a. Note that the I/O interface circuit 64 includes a communication interface between the semiconductor device and another device, such as a USB interface circuit, a vehicle-mounted communication interface circuit or a wireless communication interface, for example. Further, the peripheral circuits 65 and 66 include an application specific circuit used for the CPU core, such as an AD conversion circuit, a DA conversion circuit, a timer, a PWM signal generation circuit or a coprocessor.

To the internal bus 71, the CPU core 61 and the analysis core 62, which serve as bus masters, and the internal memory 63 and the I/O interface circuit 64, which serve as bus slaves, are connected. The sub-internal bus 72 is a sub-internal bus for the internal bus 71, and it is connected to the internal bus 71 through the analysis subsystem 30. To the sub-internal bus 72, a plurality of peripheral circuits 65, which operate only as bus slaves, are connected. The sub-internal bus 73 is a sub-internal bus for the internal bus 71, and it is connected to the internal bus 71 through the analysis subsystem 30a. To the sub-internal bus 73, the peripheral circuits 66, which can switch between operating as bus slaves and operating as bus masters, are connected.

Further, the sub-internal bus 72 includes an address decoder DEC_A that performs decoding of an address signal, and the sub-internal bus 73 includes an address decoder DEC_B that performs decoding of an address signal. The sub-internal buses 72 and 73 control the transmission and reception of signals between an access destination and an access source by the address decoders placed inside of them. Further, the decoders DEC_A and DEC_B are different in their ways of generating an address. Differences between the operation of the decoder DEC_A and the operation of the decoder DEC_B are described hereinbelow.

Figure 12:
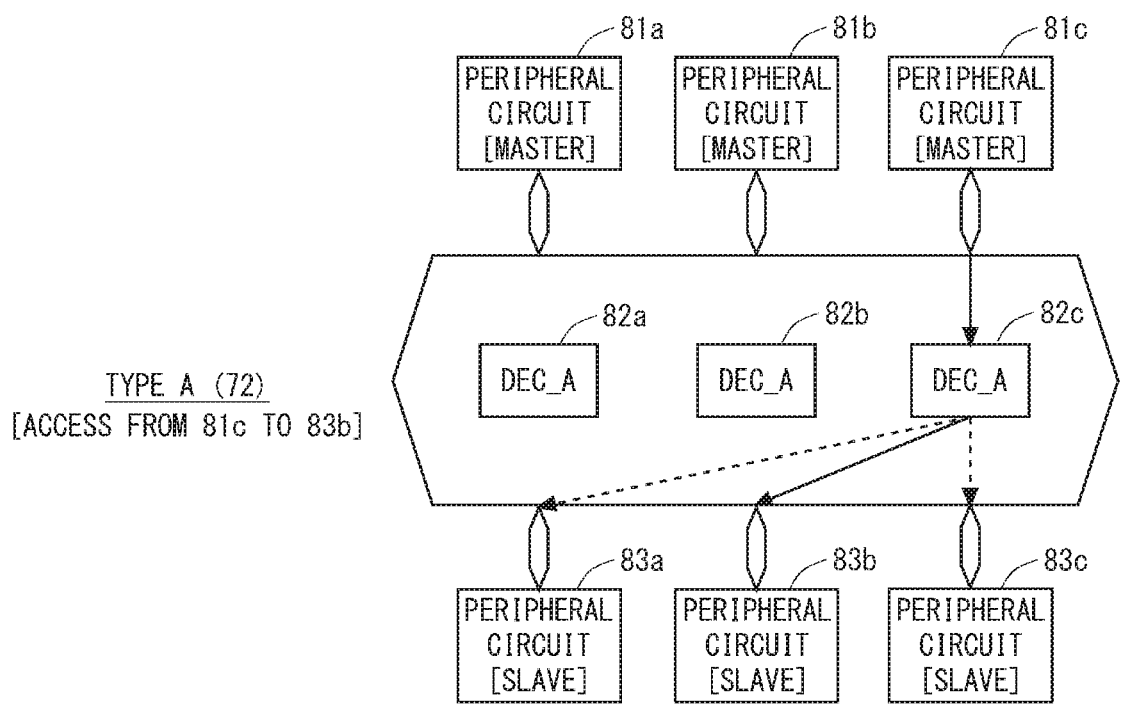
FIG. 12 is a view illustrating the operation of address decoders of a first bus shown in FIG. 11.

First, FIG. 12 shows a view illustrating the operation of the address decoder of the first bus (e.g., the sub-internal bus 72) shown in FIG. 11. In the example shown in FIG. 12, peripheral circuits 81a to 81c, which serve as bus masters, and peripheral circuits 83a to 83c, which serve as bus slaves, are connected to the sub-internal bus 72. Further, address decoders 82a to 82c are placed inside the sub-internal bus 72. The address decoders 82a to 82c are placed corresponding to the peripheral circuits 81a to 81c, which serve as bus masters. The address decoders 82a to 82c generate an address signal that specifies any one of the peripheral circuits 83a to 83c to be accessed based on an input address signal. For example, although the address decoder 82c can generate an access address which corresponds to any of the peripheral circuits 83a to 83c, when the peripheral circuit 81c applies the address signal that indicates the peripheral circuit 83b to the peripheral circuit 82c, the peripheral circuit 82c generates an access address that indicates the peripheral circuit 83b. The analysis subsystem 30 functions as the peripheral circuits 81a to 81c.

Figure 13:
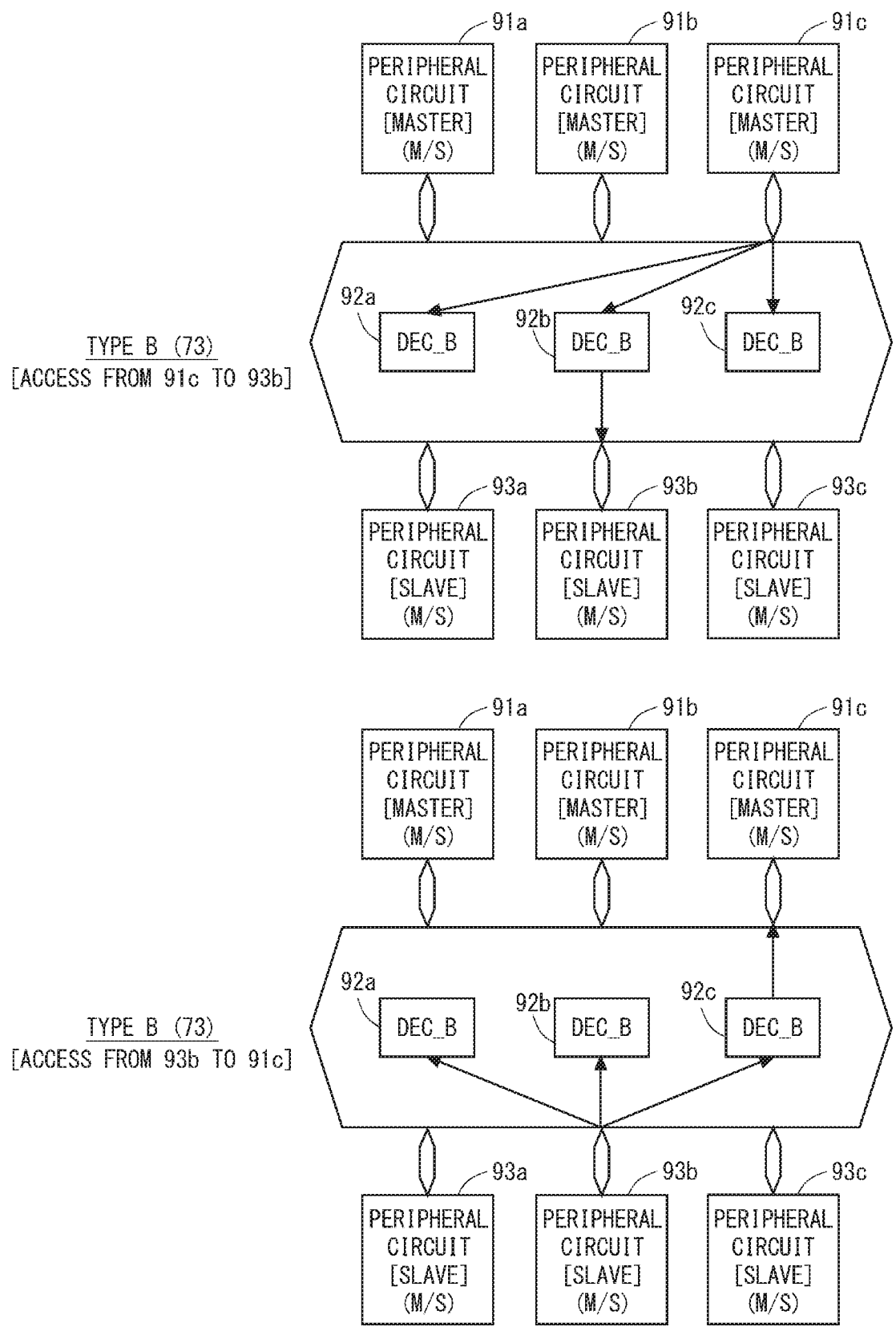
FIG. 13 is a view illustrating the operation of address decoders of a second bus shown in FIG. 11.

Next, FIG. 13 shows a view illustrating the operation of the address decoder of the second bus (e.g., the sub-internal bus 73) shown in FIG. 11. In the example shown in FIG. 13, peripheral circuits that can operate by switching bus masters and bus slaves are connected to the sub-internal bus 73. Further, in the example shown in FIG. 13, peripheral circuits 91a to 91c and peripheral circuits 93a to 93c are connected to each other through the sub-internal bus 73. Address decoders 92a to 92c are placed inside the sub-internal bus 73. An address signal is input to the address decoders 92a to 92c from an access source peripheral circuit. Then, in the address decoders 92a to 92c, only the address decoder which corresponds to an access destination peripheral circuit passes the input access address.

In the example shown in FIG. 13, when access is made from the peripheral circuit 91c to the peripheral circuit 93b, an access address issued from the peripheral circuit 91c is input to the address decoders 92a to 92c, and only the address decoder 92b corresponding to the peripheral circuit 93b passes the access address. Further, when access is made from the peripheral circuit 93b to the peripheral circuit 91c, an access address issued from the peripheral circuit 93b is input to the address decoders 92a to 92c, and only the address decoder 92c corresponding to the peripheral circuit 91c passes the access address. The analysis subsystem 30a functions as the peripheral circuits 91a to 91c.

By using the analysis subsystem 30a, when setting the peripheral circuits 93a to 93c as the analysis target peripheral circuits, for example, it is possible to generate, by the module selector 33b, a plurality of addresses indicating the peripheral circuits 93a to 93c and apply the plurality of addresses respectively to the address decoders 92a to 92c.

As described above, there are various bus formats, and by using the analysis subsystem 30a that includes the the module selector 33b, it is possible to perform the same analysis process as in the first embodiment in the system that includes a bus of the type of the sub-internal bus 73, not limited to the type of the sub-internal bus 72.

Fourth Embodiment

Figure 14:
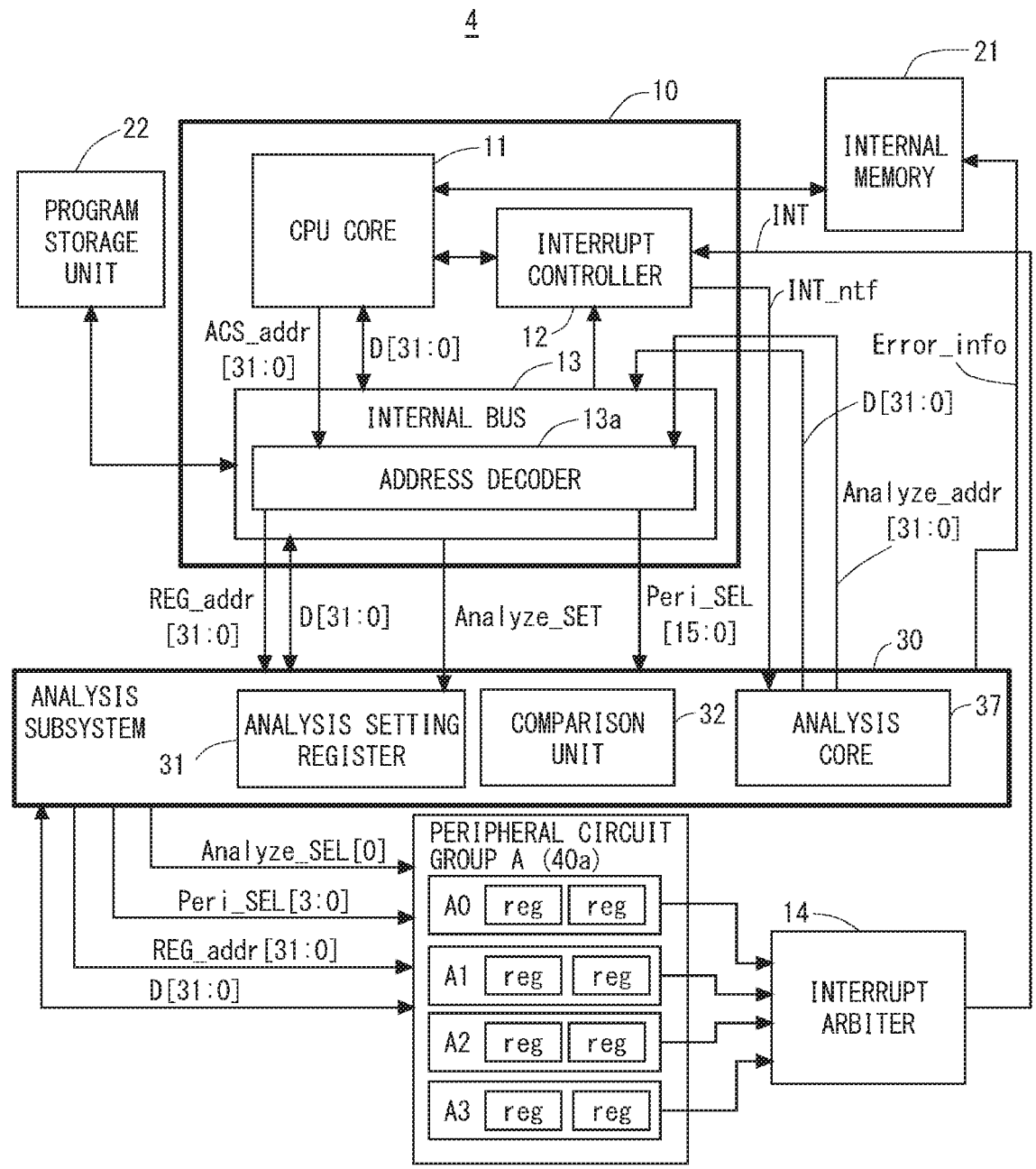
FIG. 14 is a block diagram of a semiconductor device according to a fourth embodiment.

In a fourth embodiment, a semiconductor device 4, which is another embodiment of the semiconductor device 1 according to the first embodiment, is described. FIG. 14 shows a block diagram of a semiconductor device according to the fourth embodiment. Note that the peripheral circuit groups 40b to 40d are not shown in FIG. 14.

As shown in FIG. 14, the semiconductor device 4 according to the fourth embodiment has a configuration where an interrupt arbiter 14 is added to the semiconductor device according to the first embodiment. When an abnormality occurs in a peripheral circuit, the interrupt arbiter 14 arbitrates a plurality of interrupt requests respectively made from a plurality of peripheral circuits, and notifies the CPU core 11 of any one of the plurality of interrupt requests. To be specific, the interrupt arbiter 14 selects the interrupt request made from the comparison target peripheral circuit and notifies the CPU core 11 of that request. Further, the interrupt controller 12 to which the interrupt request is input from the interrupt arbiter 14 outputs an interrupt notification signal INT_ntf to notify the analysis core 37 that the interrupt request is made from the peripheral circuit.

In the semiconductor device 1 according to the first embodiment, a plurality of peripheral circuits operate under the same operation instruction during the same period in the anslysis mode. Therefore, when an abnormality occurs in a peripheral circuit due to a problem of a user program, not a defect of the peripheral circuit, for example, interrupt requests are issued at the same time from a plurality of peripheral circuits. Thus, in the semiconductor device 1 according to the first embodiment, there is a possibility that a plurality of interrupt requests with the same priority are made at the same time.

In the case where a plurality of interrupt requests with the same priority are made at the same time as described above, the CPU core 11 cannot determine which interrupt request is to be selected to perform interrupt processing, which causes deadlock where the semiconductor device 1 stops in the program execution state, hindering the execution of analysis.

The semiconductor device 4 according to the fourth embodiment arbitrates a plurality of interrupt requests that are made at the same time by using the interrupt arbiter 14, and outputs only the interrupt request made from the comparison target peripheral circuit to the interrupt controller 12. The CPU core 11 can thereby clear an interrupt flag by performing exception processing on the comparison target peripheral circuit in response to one interrupt request INT. Further, the interrupt controller 12 can be notified, by an interrupt notification signal INT_ntf, that an interrupt request is made to the analysis core 37 in the peripheral circuit group, and thereby perform exception processing in accordance with the interrupt notification signal INT_ntf.

Exception processing that clears an interrupt flag in the analysis mode is described hereinbelow. In the semiconductor device 4 according to the fourth embodiment, the analysis core 37 that has received the interrupt notification signal INT_ntf performs exception processing that is previously defined in the program and thereby clears an interrupt request of the comparison target peripheral circuit. At this time, in the semiconductor device 4 according to the fourth embodiment, it is possible to clear the interrupt requests from analysis target peripheral circuits other than the comparison target peripheral circuit by the setting of the module selector 33. Further, when a channel where the state of an output interface of an interrupt request does not change correctly exists when performing clear control, it is detectable by the comparison unit 32.

Further, with the interrupt arbiter 14, it is possible to reduce the processing that the CPU core 11 clears an interrupt flag in the user mode and minimize an increase in the number of channels of the interrupt controller 12.

Further, with the interrupt arbiter 14, in the semiconductor device 4 according to the fourth embodiment, only an interrupt request which is made from the comparison target peripheral circuit is notified to the interrupt controller 12. Thus, the semiconductor device 4 according to the fourth embodiment cannot detect interrupt requests from analysis target peripheral circuits; however, in the case where an unintended interrupt occurs in an analysis target peripheral circuit, an interface is compared with an interrupt output of a comparison target peripheral circuit by the comparison unit 32 and a difference is thereby detected, and therefore an interrupt request due to the difference is made from the analysis subsystem 30.

Further, a higher priority is placed on an interrupt request that is notified from the analysis subsystem 30 than on an interrupt request that is notified from the interrupt arbiter 14, and therefore the interrupt arbiter 14 does not interfere with the analysis.

Fifth Embodiment

Figure 15:
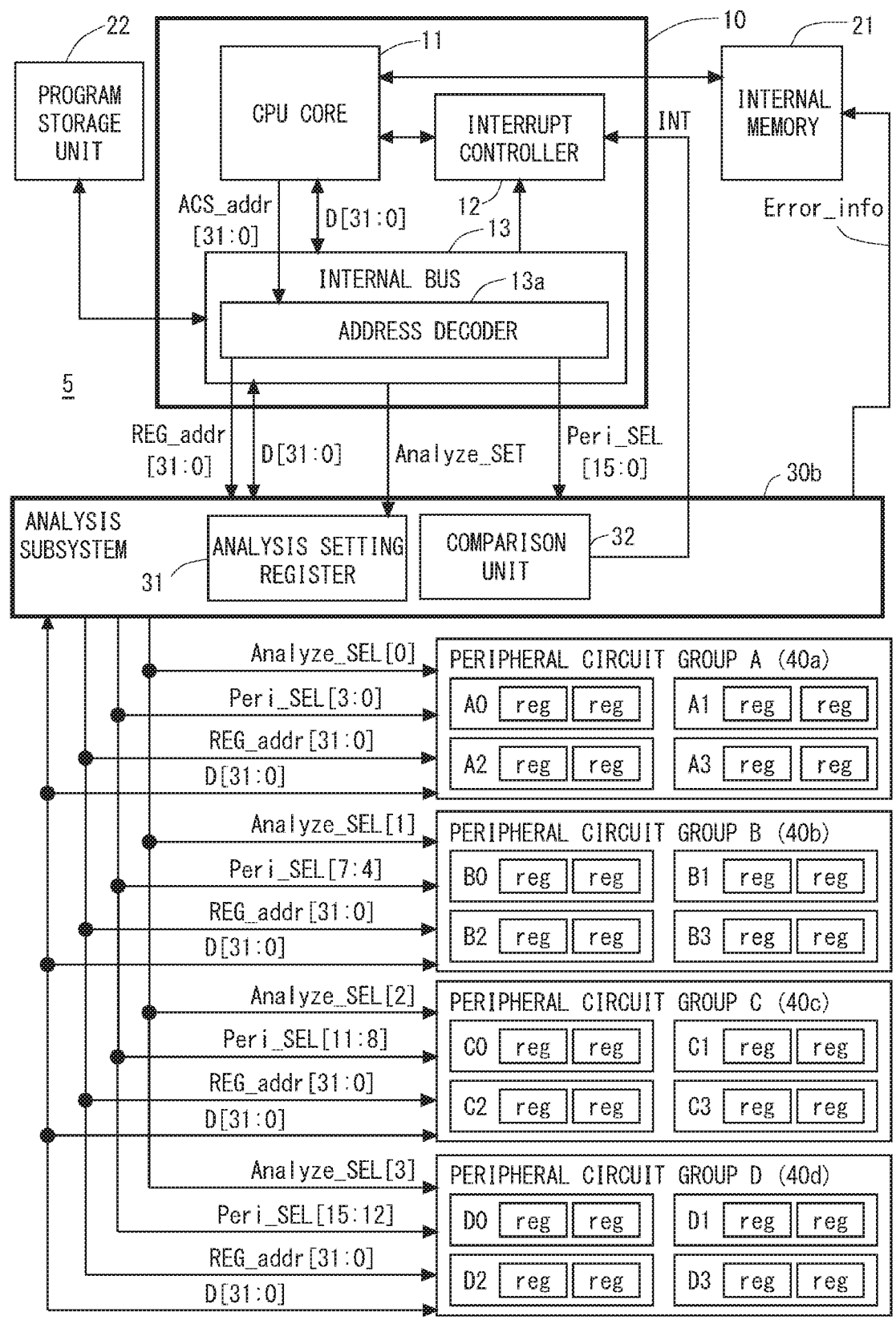
FIG. 15 is a block diagram of a semiconductor device according to a fifth embodiment.
Figure 16:
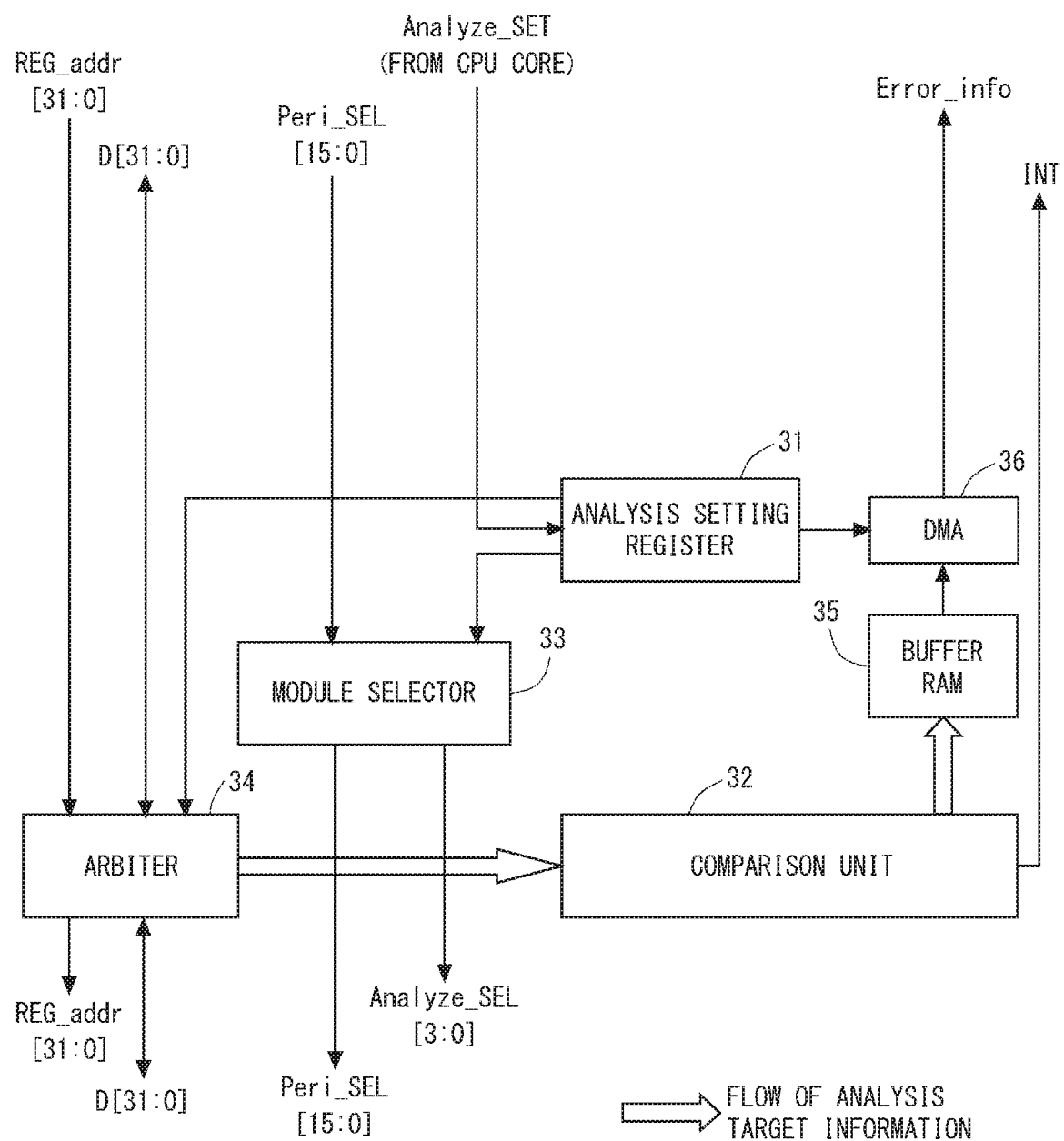
FIG. 16 is a block diagram of an analysis subsystem according to the fifth embodiment.

In a fifth embodiment, an analysis subsystem 30b, which is another embodiment of the analysis subsystem 30 according to the first embodiment, is described. FIG. 15 shows a block diagram of a semiconductor device 5 according to the fifth embodiment, which includes the analysis subsystem 30b. FIG. 16 shows a block diagram of the analysis subsystem 30b.

As shown in FIGS. 15 and 16, the analysis subsystem 30b has a configuration where the analysis core 37 is eliminated from the analysis subsystem 30. In the semiconductor device 5 according to the fifth embodiment, the execution of a user program in the analysis mode is done by the CPU core 11. The operation of the semiconductor device 5 according to the fifth embodiment is described hereinafter with reference to FIGS. 17 and 18.

Figure 17:
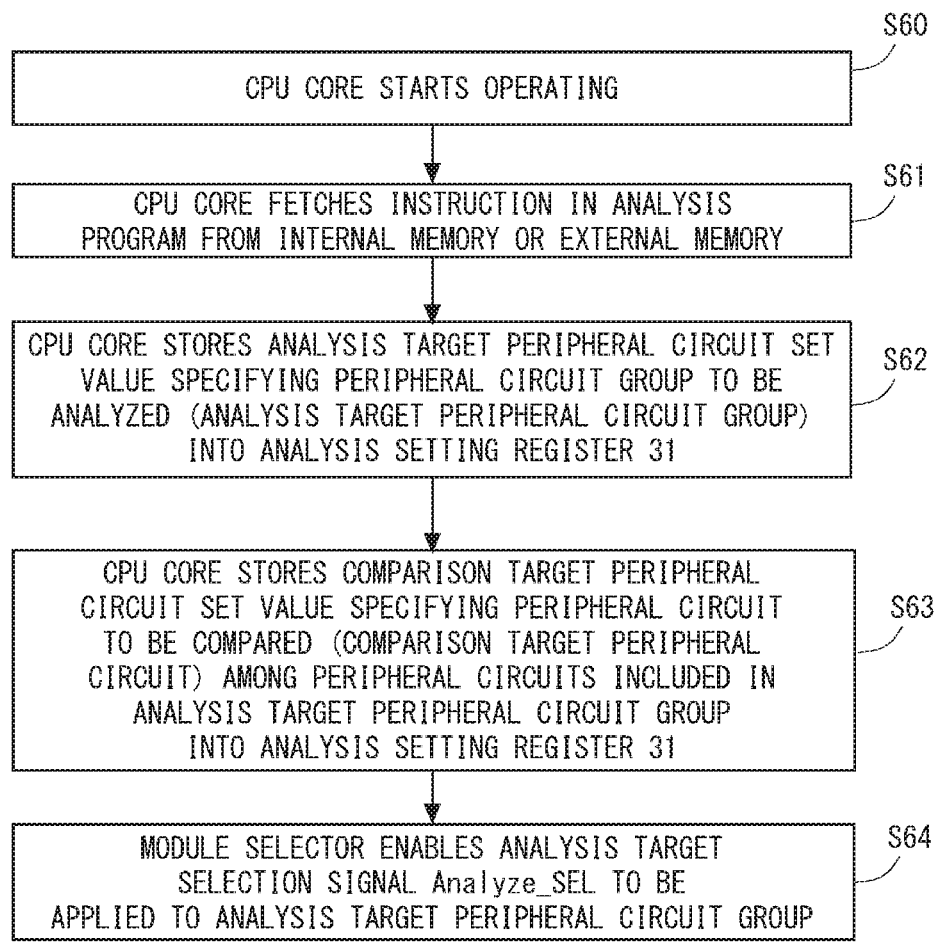
FIG. 17 is a flowchart showing the flow of a first analysis step of the semiconductor device according to the fifth embodiment.

FIG. 17 is a flowchart showing the flow of the first analysis step in the semiconductor device according to the fifth embodiment. As shown in FIG. 17, in the first analysis step, the CPU core 11 starts operating (Step S60). Next, the CPU core 11 fetches an instruction in an analysis program (e.g., a user program) to be used for analysis from an internal memory or an external memory, and thereby the user program is executed (Step S61). It is assumed that the user program contains an instruction to generate analysis execution set values to be stored into the analysis setting register 31. Then, the CPU core 61 stores an analysis target peripheral circuit set value that specifies a peripheral circuit group to be analyzed (e.g., an analysis target peripheral circuit group) into the analysis setting register (Step S62). Further, the CPU core 11 stores a comparison target peripheral circuit set value that specifies a peripheral circuit to be compared (e.g., a comparison target peripheral circuit) among the peripheral circuits included in the analysis target peripheral circuit group into the analysis setting register 31 (Step S63). By the operations in the Steps S62 and S63, the module selector 33 refers to the analysis execution set values in the analysis setting register 31, and switches the analysis target selection signal Analyze_SEL to be applied to the analysis target peripheral circuit group to Enabled (Step S64).

Figure 18:
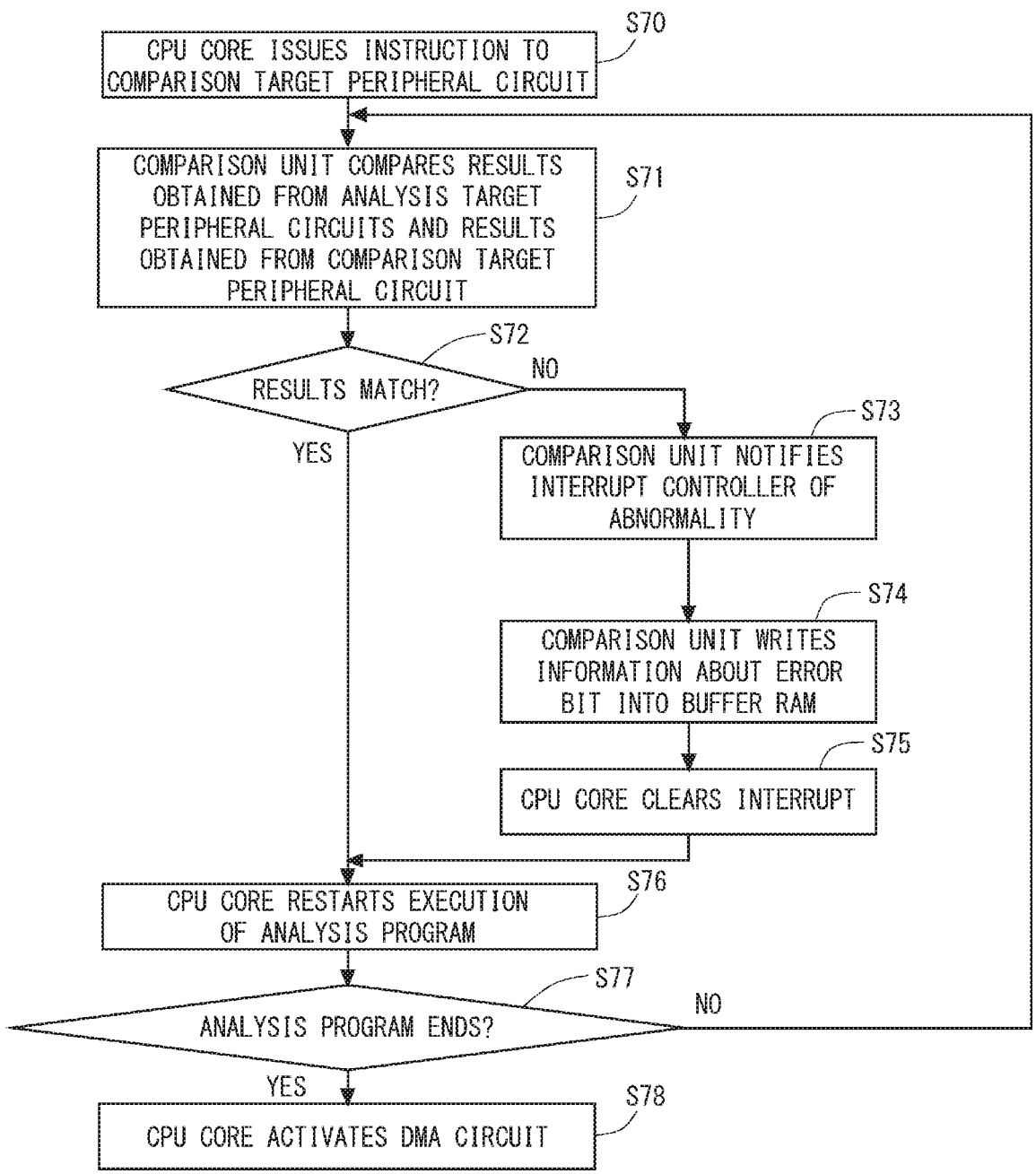
FIG. 18 is a flowchart showing the flow of a second analysis step of the semiconductor device according to the fifth embodiment.

FIG. 18 is a flowchart showing the flow of the second analysis step in the semiconductor device according to the fifth embodiment. As shown in FIG. 18, in the second analysis step of the semiconductor device 5 according to the fifth embodiment, the CPU core 11 fetches an instruction of a user program stored in the internal memory 21 or the program storage unit 22 based on a start fetch address and thereby starts the execution of the user program, and issues an operation instruction to a comparison target peripheral circuit based on the user program (Step S70).

Then, the comparison unit 32 compares results obtained as a result that the peripheral circuits operate in accordance with the operation instruction (Step S71). In Step S71, the arbiter 34 extracts signals exchanged between the analysis core 37 and the analysis target peripheral circuit group based on the analysis target peripheral circuit set value and the comparison target peripheral circuit set value stored in the analysis setting register 31 and supplies the signals to the comparison unit 32.

Then, when it is determined by the comparison in Step S71 that the analysis information acquired from the peripheral circuits included in the analysis target peripheral circuit group match (Yes in Step S72), the analysis core 37 restarts the execution of the user program (Step S76), and repeats the operations from Step S71 to Step S76 (Step S77).

On the other hand, when it is determined by the comparison in Step S71 that the analysis information acquired from the peripheral circuit included in the analysis target peripheral circuit group contains a bit that does not match the other comparison result (No in Step S72), the comparison unit 32 makes an interrupt request to the interrupt controller 12 and thereby notifies the CPU core 11 of the occurrence of an abnormality (Step S73). Then, the comparison unit 32 writes information about the error bit as the error information Error_Info into the buffer RAM 35 (Step S74). After that, the CPU core 11 clears the interrupt request that is notified from the comparison unit 32, and then the CPU core 11 restarts the operation (Step S76). The CPU core 11 thereby restarts the operation and restarts the execution of the user program (Step S76), Then, the CPU core 11 continues the operations from Step S71 to Step S76 until the execution position of the user program reaches the end fetch address (Step S77).

When it is determined in Step S77 that the analysis process where the CPU core 11 executes the user program has ended, the CPU core 11 activates the DMA circuit 36 (Step S78).

Figure 19:
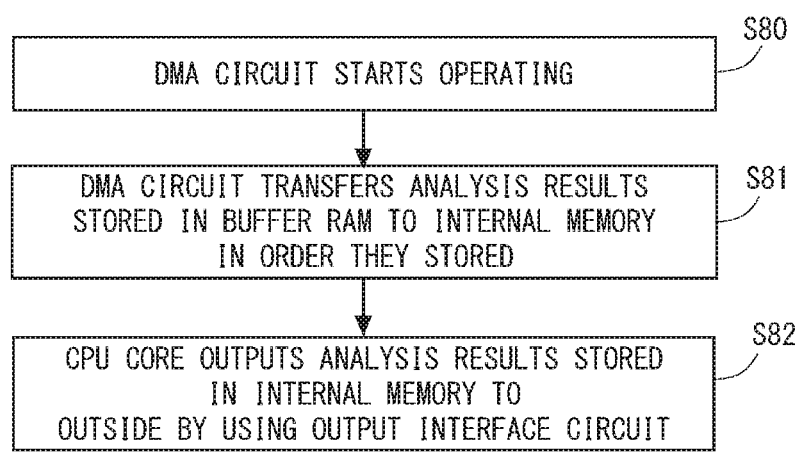
FIG. 19 is a flowchart showing the flow of a third analysis step of the semiconductor device according to the fifth embodiment.

FIG. 19 is a flowchart showing the flow of the third analysis step in the semiconductor device according to the fifth embodiment. As shown in FIG. 7, in the third analysis step, the DMA circuit 36 is activated based on the instruction from the analysis core 37 in Step S30 in the second analysis step (Step S41). Then, the DMA circuit 36 transfers, to the internal memory 21, the analysis results (e.g., the error information Error_Info) stored in the buffer RAM 35 in the order they stored (Step S42). In response to completion of transfer of the error information Error_Info from the buffer RAM 35 to the internal memory 21, the CPU core 11 cancels the standby state (Step S43). The CPU core 11 then outputs the error information Error_Info stored in the internal memory 21 to the outside by using an output interface circuit (not shown) (Step S44).

As described above, the defect analysis of a peripheral circuit group, which is similar to the analysis in the first embodiment, may be performed also by the CPU core 11 executing a user program in the analysis mode, without placing the analysis core. The analysis core 37 is a circuit havin the same circuit configuration as the CPU core 11, and it occupies a large area on a chip. The chip area can be reduced by eliminating the analysis core 37.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first to fifth embodiments can be combined as desirable by one of ordinary skill in the art.

What is claimed is:

1. A semiconductor device comprising:
    a program execution unit configured to execute a user program;
    a peripheral circuit group configured to include a plurality of peripheral circuits having the same circuit configuration and controlled by the program execution unit; and an analysis subsystem configured to perform defect analysis of the peripheral circuit group based on the user program in accordance with an operation instruction from the program execution unit, wherein the analysis subsystem includes an analysis setting register configured to store analysis execution set values at least including an analysis target peripheral circuit set value specifying an analysis target peripheral circuit group including a plurality of analysis target peripheral circuits to be used for the defect analysis among the peripheral circuits included in the peripheral circuit group and a comparison target peripheral circuit set value specifying a comparison target peripheral circuit to be compared among the peripheral circuits included in the analysis target peripheral circuit group, a module selector configured to control an operating state of the peripheral circuit group so that all of the analysis target peripheral circuits included in the analysis target peripheral circuit group operate based on the analysis target peripheral circuit set value, an arbiter configured to distribute, to the plurality of peripheral circuits included in the analysis target peripheral circuit group, the operation instruction output from the program execution unit to the comparison target peripheral circuit based on the comparison target peripheral circuit set value and the analysis target peripheral circuit set value and then extracts, as analysis information, data output from the plurality of peripheral circuits included in the analysis target peripheral circuit group in response to the given operation instruction, and transmits the data output from the comparison target peripheral circuit to the program execution unit, and a comparison unit configured to compare information obtained from each of the plurality of peripheral circuits included in the analysis target peripheral circuit group based on the analysis information, and output error information identifying a location of a bit indicating a different value.

2. The semiconductor device according to claim 1, wherein the comparison unit compares an address signal indicating a destination of the operation instruction output from the program execution unit, the address signal being applied to each of the plurality of peripheral circuits included in the analysis target peripheral circuit group, and outputs, as the error information, address error information identifying a location of a bit value indicating a different address value.

3. The semiconductor device according to claim 1, wherein the comparison unit operates based on an operating clock applied to the analysis target peripheral circuit group among operating clocks applied to the peripheral circuit group.

4. The semiconductor device according to claim 1, wherein the program execution unit includes a CPU core configured to output, to the analysis setting register, the analysis execution set values at least including the analysis target peripheral circuit set value, the comparison target peripheral circuit set value, and a fetch address identifying a location of an instruction to be executed among instructions in the user program, and an analysis core configured to execute the user program based on the fetch address included in the analysis execution set values stored by the CPU core into the analysis setting register.

5. The semiconductor device according to claim 4, wherein, during an analysis mode where the analysis core executes the user program based on the analysis execution set values, the CPU core stops execution of the user program until execution of the user program by the analysis core stops, or executes the user program and makes peripheral circuits not included in the analysis target peripheral circuit group operate.

6. The semiconductor device according to claim 1, wherein in a normal operation mode where the analysis execution set values are not stored in the analysis setting register, the module selector outputs an individual module address signal that puts each of the plurality of peripheral circuits into an operating state individually based on a module address signal supplied from the program execution unit, and in an analysis mode where the analysis execution set values are stored in the analysis setting register, the module selector outputs an analysis target selection signal that puts all of the analysis target peripheral circuits included in the analysis target peripheral circuit group into an operating state, regardless of the module address signal.

7. The semiconductor device according to claim 1, wherein in a normal operation mode where the analysis execution set values are not stored in the analysis setting register, the module selector shifts a module address signal supplied from the program execution unit by a shift amount determined for each peripheral circuit to be accessed, and generates a peripheral address signal specifying the peripheral circuit individually, and in an analysis mode where the analysis execution set values are stored in the analysis setting register, the module selector outputs a plurality of module address signals corresponding to all of the peripheral circuits included in the analysis target peripheral circuit group from the module address signal.

8. The semiconductor device according to claim 1, comprising:

an interrupt arbiter configured to arbitrate a plurality of interrupt requests respectively issued from the plurality of peripheral circuits when an abnormality occurs in the peripheral circuit, and notifies the program execution unit of any one of the plurality of interrupt requests.

9. A semiconductor device comprising:

a first CPU core configured to execute a user program;

a peripheral circuit group configured to include a plurality of peripheral circuits having the same circuit configuration and controlled by the first CPU core; and an analysis subsystem configured to perform defect analysis of the peripheral circuit group based on the user program in accordance with an instruction from the first CPU core, wherein the analysis subsystem includes an analysis setting register configured to store analysis execution set values at least including an analysis target peripheral circuit set value specifying an analysis target peripheral circuit group including a plurality of analysis target peripheral circuits to be used for the defect analysis among the peripheral circuits included in the peripheral circuit group and a comparison target peripheral circuit set value specifying a comparison target peripheral circuit to be compared among the peripheral circuits included in the analysis target peripheral circuit group, a module selector configured to control an operating state of the peripheral circuit group so that all of the analysis target peripheral circuits included in the analysis target peripheral circuit group operate based on the analysis target peripheral circuit set value, an arbiter configured to extract analysis information containing at least one of an address and data input to and output from the plurality of peripheral circuits included in the analysis target peripheral circuit group based on the analysis target peripheral circuit set value, and transmit the data output from the comparison target peripheral circuit to a circuit located upstream based on the comparison target peripheral circuit set value, and a comparison unit configured to compare information obtained from each of the plurality of peripheral circuits included in the analysis target peripheral circuit group based on the analysis information, and output error information identifying a location of a bit indicating a different value.

10. The semiconductor device according to claim 9, wherein the comparison unit compares an address signal indicating a destination of the operation instruction output from the first CPU core, the address signal being applied to each of the plurality of peripheral circuits included in the analysis target peripheral circuit group, and outputs, as the error information, address error information identifying a location of a bit value indicating a different address value.

11. The semiconductor device according to claim 9, wherein the comparison unit operates based on an operating clock applied to the analysis target peripheral circuit group among operating clocks applied to the peripheral circuit group.

12. The semiconductor device according to claim 9, wherein the analysis subsystem further includes a second CPU core configured to execute the user program by using a comparison target peripheral circuit included in the analysis target peripheral circuit group based on a fetch address stored as one of the analysis execution set values by the first CPU core into the analysis setting register, and when the fetch address is stored into the analysis setting register, the first CPU core stops execution of the user program until execution of the user program by the second CPU core stops, or executes the program by using peripheral circuits not included in the analysis target peripheral circuit group.

13. The semiconductor device according to claim 9, wherein in a normal operation mode where the analysis execution set values are not stored in the analysis setting register, the module selector outputs an individual module address signal that puts each of the plurality of peripheral circuits into an operating state individually based on a module address signal supplied from the first CPU core, and in an analysis mode where the analysis execution set values are stored in the analysis setting register, the module selector outputs an analysis target selection signal that puts all of the peripheral circuits included in the analysis target peripheral circuit group into an operating state, regardless of the module address signal.

14. The semiconductor device according to claim 9, wherein in a normal operation mode where the analysis execution set values are not stored in the analysis setting register, the module selector shifts a module address signal supplied from the first CPU core by a shift amount determined for each peripheral circuit to be accessed, and generates a peripheral address signal specifying the peripheral circuit individually, and in an analysis mode where the analysis execution set values are stored in the analysis setting register, the module selector outputs a plurality of module address signals corresponding to all of the peripheral circuits included in the analysis target peripheral circuit group from the module address signal.

15. The semiconductor device according to claim 9, comprising:

an interrupt arbiter configured to arbitrate a plurality of interrupt requests respectively issued from the plurality of peripheral circuits when an abnormality occurs in the peripheral circuit, and notifies the first CPU core of any one of the plurality of interrupt requests.

* * * * *